US012648092B2

(12) United States Patent
Kim et al.

(10) Patent No.:    US 12,648,092 B2
(45) Date of Patent:        Jun. 2, 2026

(54) DISPLAY DEVICE

(71) Applicant: LG ELECTRONICS INC., Seoul (KR)

(72) Inventors: Hoyoung Kim, Seoul (KR); Jonghwan Lee, Seoul (KR); Haesuk Choi, Seoul (KR); Kwanghyun Ahn, Seoul (KR); Minchul Shin, Seoul (KR); Minsoo Kim, Seoul (KR); Jaecheol Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 194 days.

(21) Appl. No.: 18/291,174

(22) PCT Filed: Dec. 9, 2021

(86) PCT No.: PCT/KR2021/018639
§ 371 (c)(1),
(2) Date: Jan. 22, 2024

(87) PCT Pub. No.: WO2023/106457
PCT Pub. Date: Jun. 15, 2023

(65) Prior Publication Data
US 2024/0334625 A1      Oct. 3, 2024

(51) Int. Cl.
H05K 5/02          (2006.01)
G02F 1/1333          (2006.01)
(52) U.S. Cl.
CPC ..... H05K 5/0217 (2013.01); G02F 1/133314 (2021.01)

(58) Field of Classification Search
CPC .. H05K 5/0217; H05K 5/03; G02F 1/133314; G06F 1/1633; G06F 1/1637
See application file for complete search history.

(56) References Cited

U.S. PATENT DOCUMENTS

2017/0060187 A1      3/2017  Amano et al.
2019/0100153 A1      4/2019  Oshima et al.
(Continued)

FOREIGN PATENT DOCUMENTS

KR        1020110073813          6/2011
KR        1020150123366          11/2015
(Continued)

OTHER PUBLICATIONS

Korean Intellectual Property Office Application No. 10-2023-7037570, Office Action dated Nov. 29, 2024, 8 pages.
(Continued)

*Primary Examiner* — Sagar Shrestha
(74) *Attorney, Agent, or Firm* — LEE, HONG, DEGERMAN, KANG & WAIMEY

(57)        ABSTRACT

A display device is disclosed. The display device includes: a display panel; and a material complexed plate disposed at a rear of the display panel, wherein the material complexed plate includes: a front skin defining a front surface; a rear skin defining a rear surface and facing the front skin; a core disposed between the front skin and the rear skin, and including fibers; a fastening groove formed by pressing the front skin and the core; and a barrier disposed adjacent to the fastening groove and formed by depressing or cutting the front skin.

10 Claims, 26 Drawing Sheets

(56)            References Cited

U.S. PATENT DOCUMENTS

| | | | | |
|---|---|---|---|---|
| 2019/0132978 A1* | 5/2019 | Lim | ........................ | H05K 5/13 |
| 2020/0201382 A1* | 6/2020 | Lee | ....................... | G06F 1/1601 |

FOREIGN PATENT DOCUMENTS

| | | |
|---|---|---|
| KR | 1020170119344 | 10/2017 |
| KR | 1020180011447 | 2/2018 |
| KR | 1020200020407 | 2/2020 |
| KR | 1020210088341 | 7/2021 |
| KR | 1020210088343 | 7/2021 |
| KR | 102304817 | 9/2021 |
| KR | 102331148 | 11/2021 |

OTHER PUBLICATIONS

PCT International Application No. PCT/KR2021/018639, International Search Report dated Sep. 6, 2022, 2 pages.
Korean Intellectual Property Office Application No. 10-2023-7037570, Notice of Allowance dated May 28, 2025, 2 pages.
European Patent Office Application Serial No. 21967330.8, Search Report dated Jul. 14, 2025, 6 pages.

\* cited by examiner

DISPLAY DEVICE

CROSS-REFERENCE TO RELATED APPLICATION(S)

This application is the National Stage filing under 35 U.S.C. 371 of International Application No. PCT/KR2021/018639, filed on Dec. 9, 2021, the contents of which are all incorporated by reference herein in its entirety.

TECHNICAL FIELD

The present disclosure relates to a display device.

BACKGROUND ART

With the development of information society, there has been a growing demand for various types of display devices. In order to meet such demand, various display devices, such as a liquid crystal display (LCD), a plasma display panel (PDP), an electro luminescent display (ELD), a vacuum fluorescent display (VFD), an organic light emitting diode (OLED), and the like, have been developed and used.

Among them, a display device using an organic light emitting diode (OLED) has excellent luminance and viewing angle characteristics compared to a liquid crystal display, and requires no backlight unit, which is advantageous in that the OLED display device can be implemented as an ultra-thin display device.

Recently, there has been a lot of research on a structure for achieving rigidity of an ultra-thin large-screen display device and dissipating heat due to high image quality.

DISCLOSURE

Technical Problem

It is an objective of the present disclosure to solve the above and other problems.

It is another objective of the present disclosure to achieve structural rigidity of an ultra-thin large-screen display device.

It is yet another objective of the present disclosure to provide a display device having a heat dissipation structure that can dissipate heat due to high image quality.

It is yet another objective of the present disclosure to improve structural reliability of an ultra-thin large-screen display device.

Technical Solution

According to an aspect of the subject matter described in this application, a display device includes: a display panel; and a material complexed plate disposed at a rear of the display panel, wherein the material complexed plate includes: a front skin defining a front surface; a rear skin defining a rear surface and facing the front skin; a core disposed between the front skin and the rear skin, and including fibers; a fastening groove formed by pressing the front skin and the core; and a barrier disposed adjacent to the fastening groove and formed by depressing or cutting the front skin.

Advantageous Effects

The display device according to the present disclosure has the following effects.

According to at least one of the embodiments of the present disclosure, it is possible to achieve the structural rigidity of an ultra-thin large-screen display device.

According to at least one of the embodiments of the present disclosure, it is possible to provide a display device having a heat dissipation structure capable of dissipating heat generated due to high image quality.

According to at least one of the embodiments of the present disclosure, it is possible to provide a display device capable of improving the structural reliability of an ultra-thin large-screen display device.

Further scope of applicability of the present disclosure will become apparent from the following detailed description. However, it should be understood that the detailed description and specific embodiments such as preferred embodiments of the present disclosure are given by way of example only, since various changes and modifications within the idea and scope of the present disclosure may be clearly understood by those skilled in the art.

MODE FOR THE INVENTION

Figure 1:
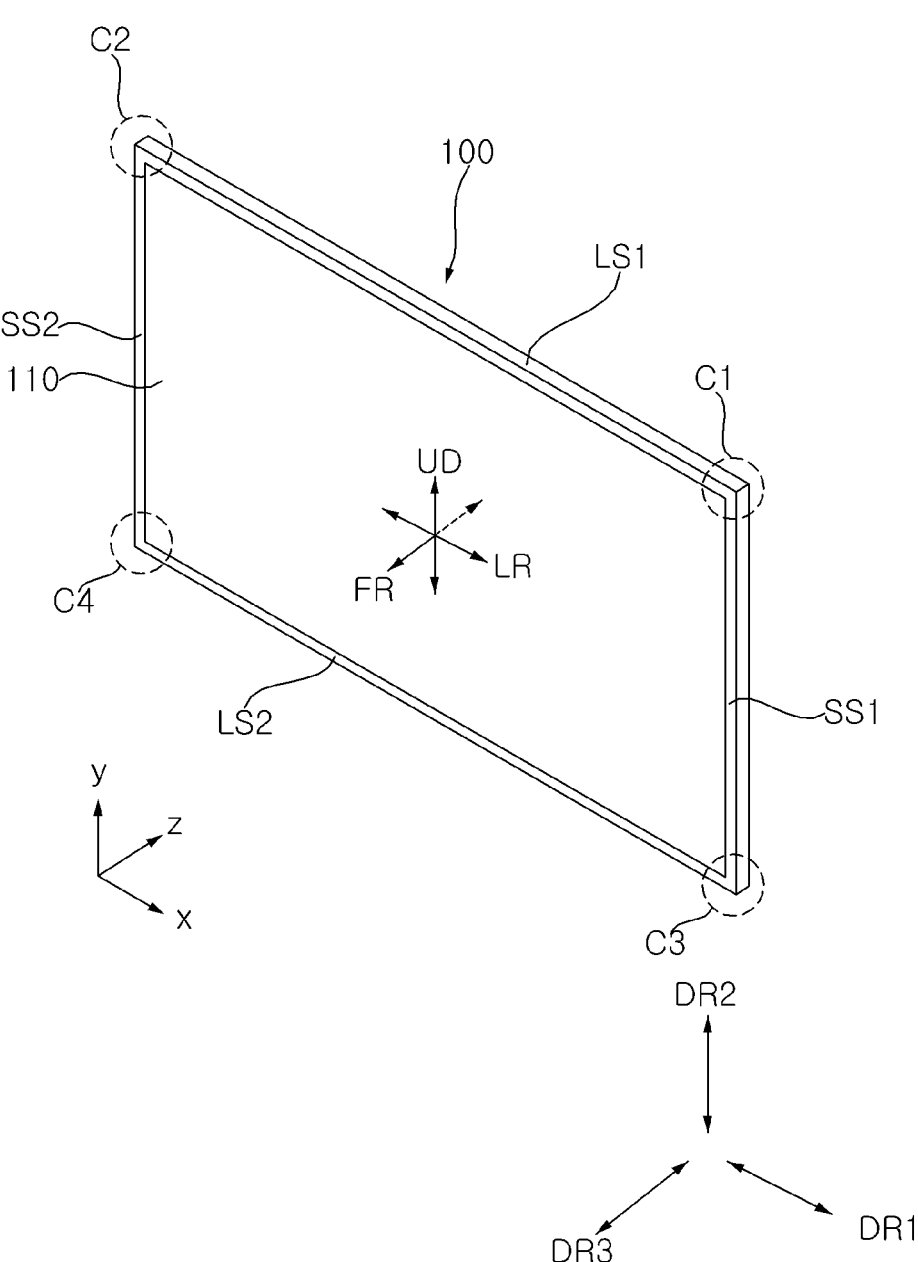
FIGS. 1 to 26 illustrate examples of a display device according to embodiments of the present disclosure.

Description will now be given in detail according to exemplary embodiments disclosed herein, with reference to the accompanying drawings. For the sake of brief description with reference to the drawings, the same or equivalent components may be denoted by the same reference numbers, and description thereof will not be repeated.

In general, suffixes such as "module" and "unit" may be used to refer to elements or components. Use of such suffixes herein is merely intended to facilitate description of the specification, and the suffixes do not have any special meaning or function.

In the present disclosure, that which is well known to one of ordinary skill in the relevant art has generally been omitted for the sake of brevity. The accompanying drawings are used to assist in easy understanding of various technical features, and it should be understood that the embodiments presented herein are not limited by the accompanying drawings. As such, the present disclosure should be construed to extend to any alterations, equivalents and substitutes, in addition to those which are particularly set out in the accompanying drawings.

It will be understood that although the terms first, second, etc. may be used herein to describe various elements, these elements should not be limited by these terms. These terms are only used to distinguish one element from another.

It will be understood that when an element is referred to as being "connected with" another element, there may be intervening elements present. In contrast, it will be understood that when an element is referred to as being "directly connected with" another element, there are no intervening elements present.

A singular representation may include a plural representation unless context clearly indicates otherwise.

In the following description, if an embodiment is described with reference to a specific figure, reference numeral not shown in the specific figure may be mentioned, if necessary or desired. However, the reference numeral not shown in the specific figure may be mentioned only when the reference numeral is shown in other figures.

Referring to FIG. 1, a display device 100 may include a display panel 110. The display panel 110 may display a screen.

The display device 100 may include a first long side LS1, a second long side LS2 opposite the first long side LS1, a first short side SS1 adjacent to the first long side LS1 and the second long side LS2, and a second short side SS2 opposite the first short side SS1.

For convenience of explanation, it is illustrated and described that lengths of the first and second long sides LS1 and LS2 are greater than lengths of the first and second short sides SS1 and SS2, but the lengths of the first and second long sides LS1 and LS2 may be substantially equal to the lengths of the first and second short sides SS1 and SS2.

A direction parallel to the long sides LS1 and LS2 of the display device 100 may be referred to as a first direction DR1 or a left-and-right direction LR. A direction parallel to the short sides SS1 and SS2 of the display device 100 may be referred to as a second direction DR2 or an up-and-down direction UD.

A direction perpendicular to the long sides LS1 and LS2 and the short sides SS1 and SS2 of the display device 100 may be referred to as a third direction DR3 or a front-and-rear direction FR. Here, a direction in which the display panel 110 displays a screen may be referred to as a front, and a direction opposite to the front may be referred to as a rear.

Hereinafter, a display panel using an organic light emitting diode (OLED) will be described as an example for the display panel 110, but the display panel 110 applicable to the present disclosure is not limited thereto.

The display panel 110 may define a front surface of the display device 100, and may display an image on the front side. The display panel 110 may include a plurality of pixels to output an image in accordance with color, brightness, and saturation of each pixel. The display panel 110 may be divided into an active area in which an image is displayed and a de-active area in which no image is displayed. The display panel 110 may generate light corresponding to a color of red, green, or blue according to a control signal.

Figure 2:
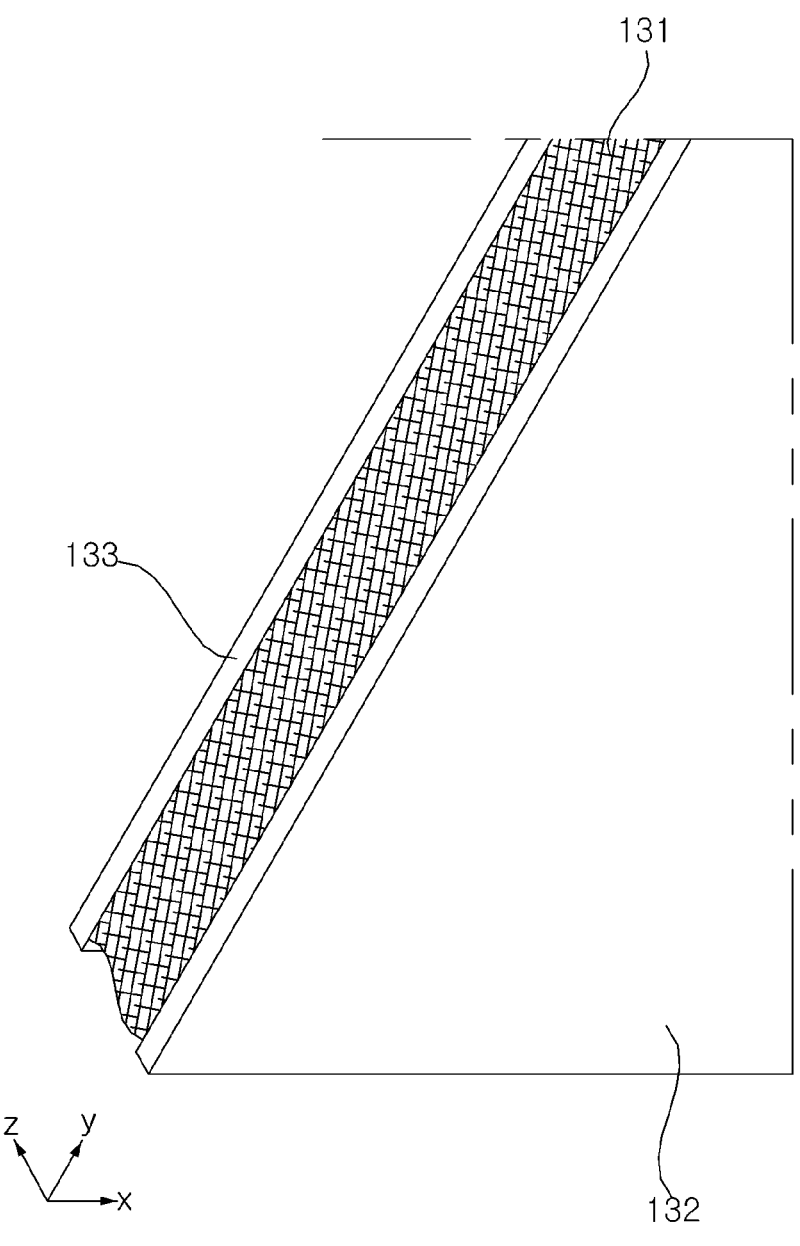

Referring to FIG. 2, a material complexed panel 130 may include a core 131, a front skin 132, and a rear skin 133. The core 131, the front skin 132, and the rear skin 133 may be coupled to each other. The material complexed panel 130 may be referred to as a fiber complexed panel 130, a fiber complexed plate 130, a material complexed plate 130, or a middle frame 130.

The front skin 132 may define a front surface of the material complexed panel 130. The rear skin 133 may define a rear surface of the material complexed panel 130. The front skin 132 and the rear skin 133 may include a metal material. For example, the front skin 132 and the rear skin 133 may include an aluminum (Al) material. For example, the front skin 132 and the rear skin 133 may have a thickness of about 0.5 mm. The front skin 132 and the rear skin 133 may be disposed opposite each other with respect to the core 131, which will be described below.

The core 131 may be disposed between the front skin 132 and the rear skin 133. The core 131 may include fibers. The core 131 may be formed of a composite material. The core 131 may include a main fiber and a binder fiber. The binder fiber may be mixed with the main fiber.

A hot melt sheet may be disposed between the front skin 132 and the core 131, and a hot melt sheet may be disposed between the rear skin 133 and the core 131. The hot melt sheet may be a film. For example, the hot melt sheet may be a film made of EVA, acrylic, polyurethane, or the like having a thickness of 50 micrometers or more. After the core 131 is placed between the front skin 132 and the rear skin 133 by the hot melt sheet, roll lamination may be performed at 190° C. for 1 minute or more.

Accordingly, bending stiffness and/or torsional stiffness of the display device may be improved.

Figure 3:
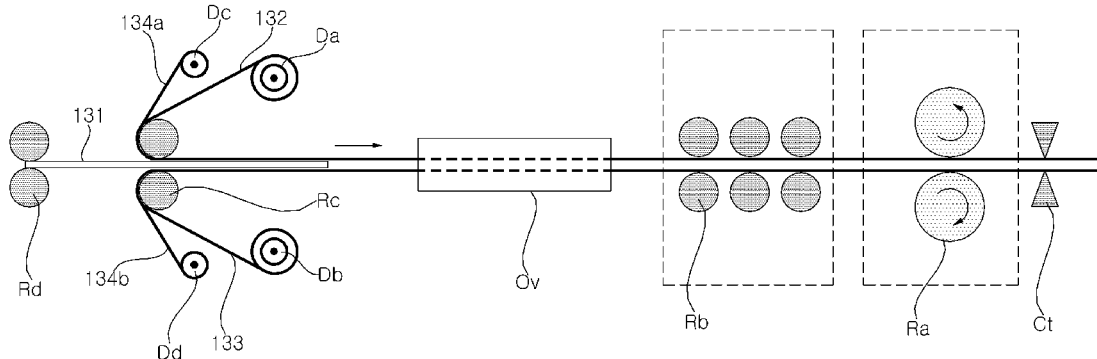
Figure 4:
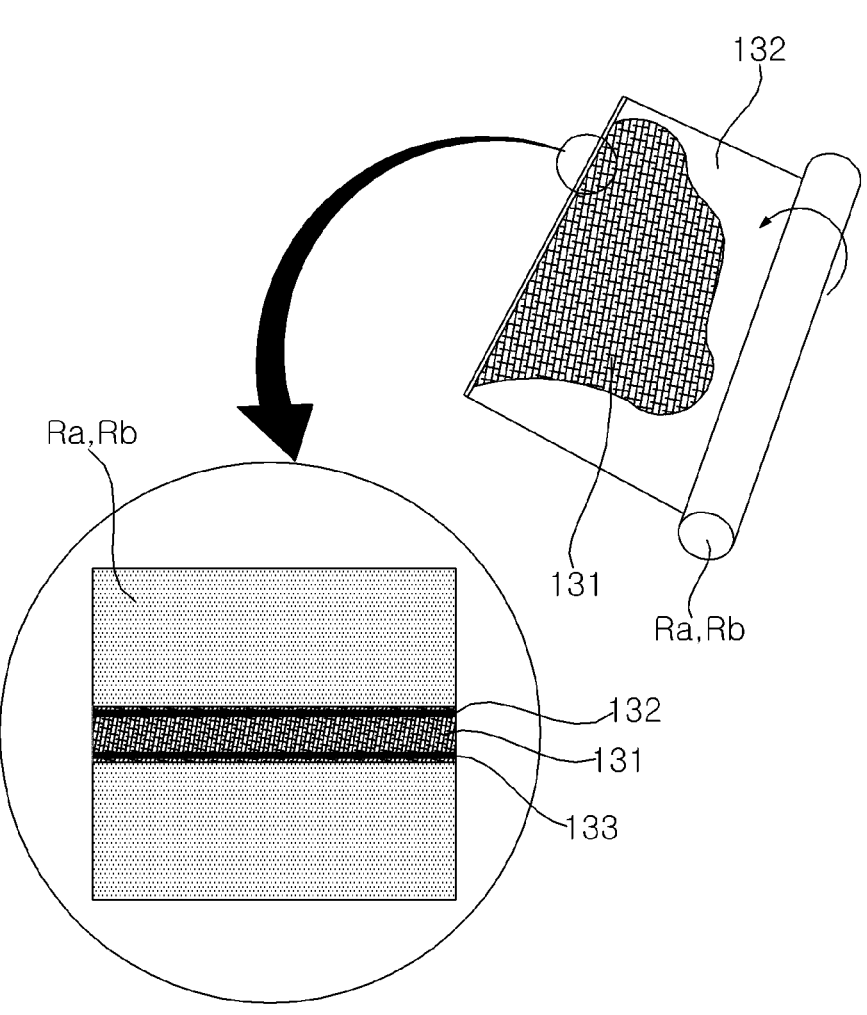

Referring to FIGS. 3 and 4, the material complexed panel 130 may be manufactured by a process of pressing the front skin 132 and the rear skin 133 onto the core 131 using a plurality of rollers, and the process may be referred to as a Roll-to-Roll (R2R) process.

Referring to FIG. 3, as a pinch roller Ra serving as a drive motor rotates, the front skin 132 may be unwound from a front drum Da, the rear skin 133 may be unwound from a rear drum Db, and the core 131 may be moved by passing through a feeding roller Rd. In addition, a first adhesive 134*a* for coupling the front skin 132 to the core 131 may be unwound from a first drum Dc. Also, a second adhesive 134*b* for coupling the rear skin 133 to the core 131 may be unwound from a second drum Db. In this case, the front skin 132, the first adhesive 134*a*, the core 131, the second adhesive 134*b*, and the rear skin 133 are stacked in this order, and may be guided toward an oven Ov by a guide roller Rc.

As the first and second adhesives 134*a* and 134*b* are melted in the oven Ov, each of the front skin 132 and the rear skin 133 may be coupled to the core 131. For example, the melting point of the first and second adhesives 134*a* and 134*b* may be about 150° C., and the ambient temperature of the oven Ov may be about 200° C. For example, the peel-off force of the first and second adhesives 134*a* and 134*b* may be about 10 kgf or more.

The front skin 132, the core 131, and rear skin 133 that have passed through the oven Ov may be guided to a press roller Rb by the rotation of the pinch roller Ra, to be pressed by the press roller Rb. Accordingly, the coupling force among the front skin 132, the core 131, and the rear skin 133 may be further increased. The front skin 132, the core 131, and rear skin 133, which are coupled to each other, may pass through the pinch roller Ra, and then may be cut by a cutter Ct to be manufactured as a material complexed panel 130 of a predetermined size.

Referring to FIG. 4, the press roller Rb or the pinch roller Ra may come into contact with an outer surface of each of the front skin 132 and the rear skin 133. When the press roller Rb or the pinch roller Ra rotates, the material complexed panel 130 may be moved in a longitudinal direction (i.e., left-and-right direction LR) of the core 131. Here, the front skin 132 and the rear skin 133 may be coupled to the core 131 sequentially from one end to the other end in the longitudinal direction of the core 131.

In addition, the front skin 132 and the rear skin 133 of the material complexed panel 130 may be formed flat. That is, as a rear surface of the rear skin 133, which defines the rear surface of the display device 100, is formed flat, additional operations, e.g., painting the rear surface of the rear skin 133, attaching a sheet thereto, etc., for an aesthetically pleasing appearance may be performed easily.

Meanwhile, in addition to the R2R process described above with reference to FIGS. 3 and 4, in which the front skin 132 and the rear skin 133 are formed flat, a process of sequentially stacking the front skin 132, the core 131, and the rear skin 133 followed by coupling the same may also be performed to couple the core 131, the front skin 132, and the rear skin 133 together.

Figure 5:
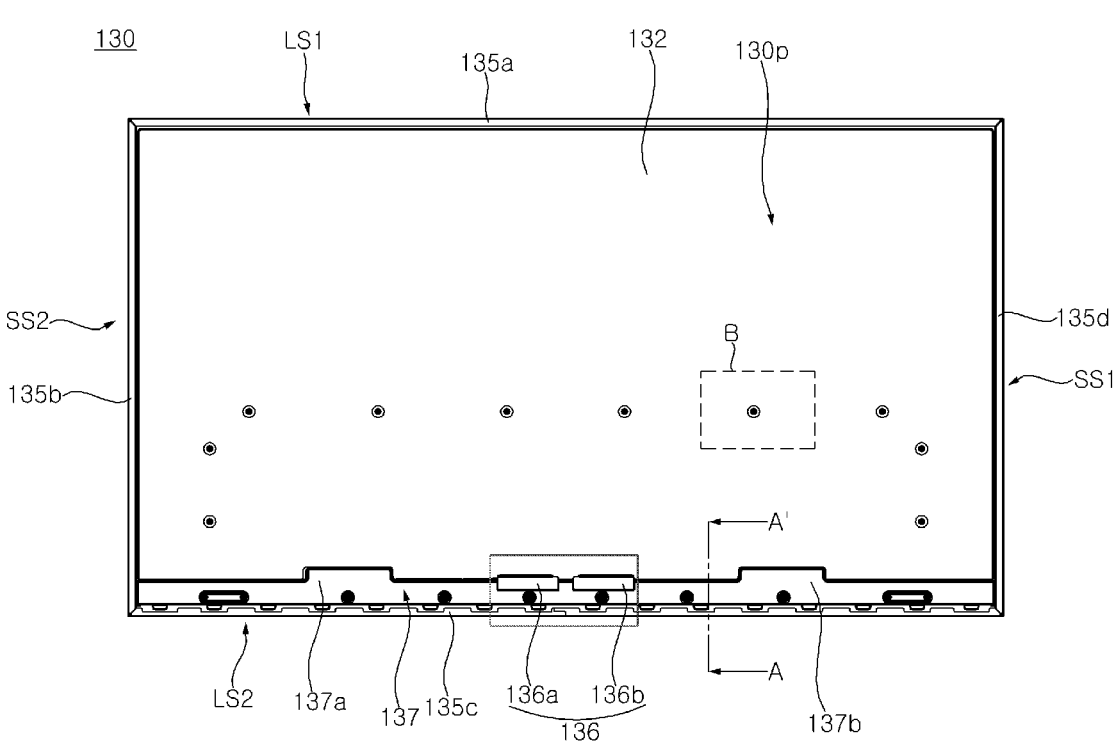

Referring to FIG. 5, the material complexed panel 130 may include a flat part 130P, an accommodating part 137, and an outer part 135. The outer part 135 may be formed around the flat part 130P. A first outer part 135a may be formed along an upper side of the flat part 130P, a second outer part 135b may be formed along a left side of the flat part 130P, a third outer part 135c may be formed along a lower side of the flat part 130P, and a fourth outer part 135d may be formed along a right side of the flat part 130P. The outer part 135 may be formed by pressing the flat part 130P. As the outer part 135 is lowered from the flat part 130P, a step difference may be formed. The thickness of the flat part 130P may be greater than the thickness of the outer part 135.

A cable hole 136 may be formed through the front skin 132 (see FIG. 2) and the rear skin 133 (see FIG. 2) of the accommodating part 137. The cable hole 136 may be formed in the accommodating part 137 adjacent to the lower side of the flat part 130P. The cable hole 136 may be provided in plurality. A first cable hole 136a may be disposed adjacent to a second cable hole 136b.

The accommodating part 137 may be formed between the flat part 130P and the third outer part 135c while being adjacent to the lower side of the flat part 130P. The accommodating part 137 may be provided in plurality. A first accommodating part 137a may be positioned between the first cable hole 136a and the second short side SS2. A second accommodating part 137b may be positioned between the second cable hole 136b and the first short side SS1. The accommodating part 137 may be formed by pressing the flat part 130P. As the accommodating part 137 is lowered from the flat part 130P and/or the outer part 135c, a step difference may be formed.

Figure 6:
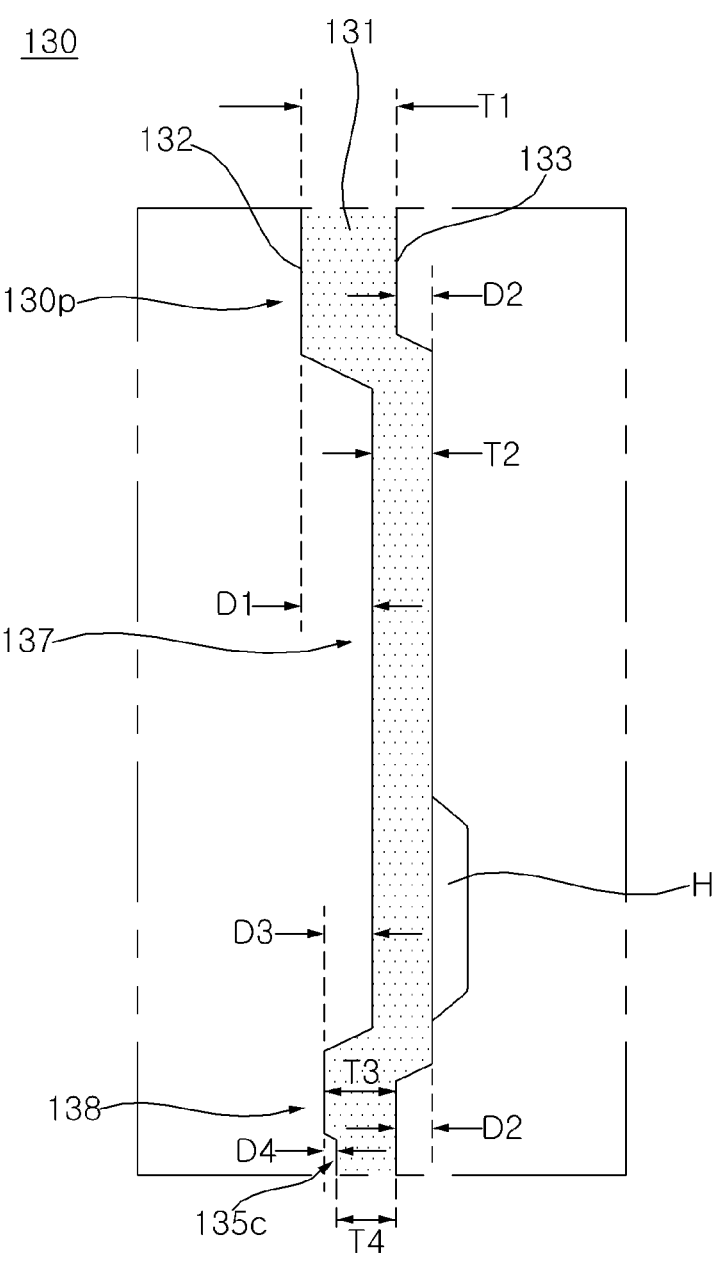

Referring to FIG. 6, the accommodating part 137 may be formed by pressing the flat part 130P. The front skin 132 of the accommodating part 137 may form a step D1 that is lowered from the front skin 132 of the flat part 130P. The rear skin 133 of the accommodating part 137 may form a step D2 that is raised from the rear skin 133 of the flat part 130P. Here, the height of the step D1 down from the front skin 132 of the flat part 130P to the front skin 132 of the accommodating part 137 may be greater than the height of the step D2 up from the rear skin 133 of the flat part 130P to the rear skin 133 of the accommodating part 137. A thickness T1 of the flat part 130P may be greater than a thickness T2 of the accommodating part 137.

The core 131 of the material complexed panel 130 may absorb an external force while being pressed in a direction from the front skin 132 to the rear skin 133 of the flat part 130P. The magnitude of external force applied to the front skin 132 of the flat part 130P may be greater than the magnitude of external force applied to the rear skin 133 of the flat part 130P. The core 131 of the material complexed panel 130 may absorb impact as well as achieve rigidity.

A thickness T4 of the third outer part 135c may be greater than the thickness T2 of the accommodating part 137. A step D2 that is raised from the rear skin 133 of the third outer part 135c to the rear skin 133 of the accommodating part 137 may be formed. The height of the step D2 between the rear skin 133 of the third outer part 135c and the rear skin 133 of the accommodating part 137 may be equal to the height of the step D2 between the rear skin 133 of the accommodating part 137 and the rear skin 133 of the flat part 130P.

A protruding pad 138 may be formed by protruding from the front skin 132 of the third outer part 135c. The front skin 132 of the protruding pad 138 may form a step D4 that is lowered to the front skin 132 of the third outer part 135c. The height of the step D4 formed by the third outer part 135c and the protruding pad 138 may be less than the height of the steps D1 and D2 formed by the flat part 130P and the accommodating part 137. A thickness T3 of the protruding pad 138 may be greater than the thickness T4 of the third outer part 135c, may be less than the thickness T1 of the flat part 130P, and may be less than the thickness T2 of the accommodating part 137.

A fastening groove H may protrude from the rear skin 133 of the accommodating part 137. The fastening groove H may be recessed in the front skin 132 of the accommodating part 137 and protrude from the rear skin 133 of the accommodating part 137. A central portion of the fastening groove H may be penetrated.

Figure 7:
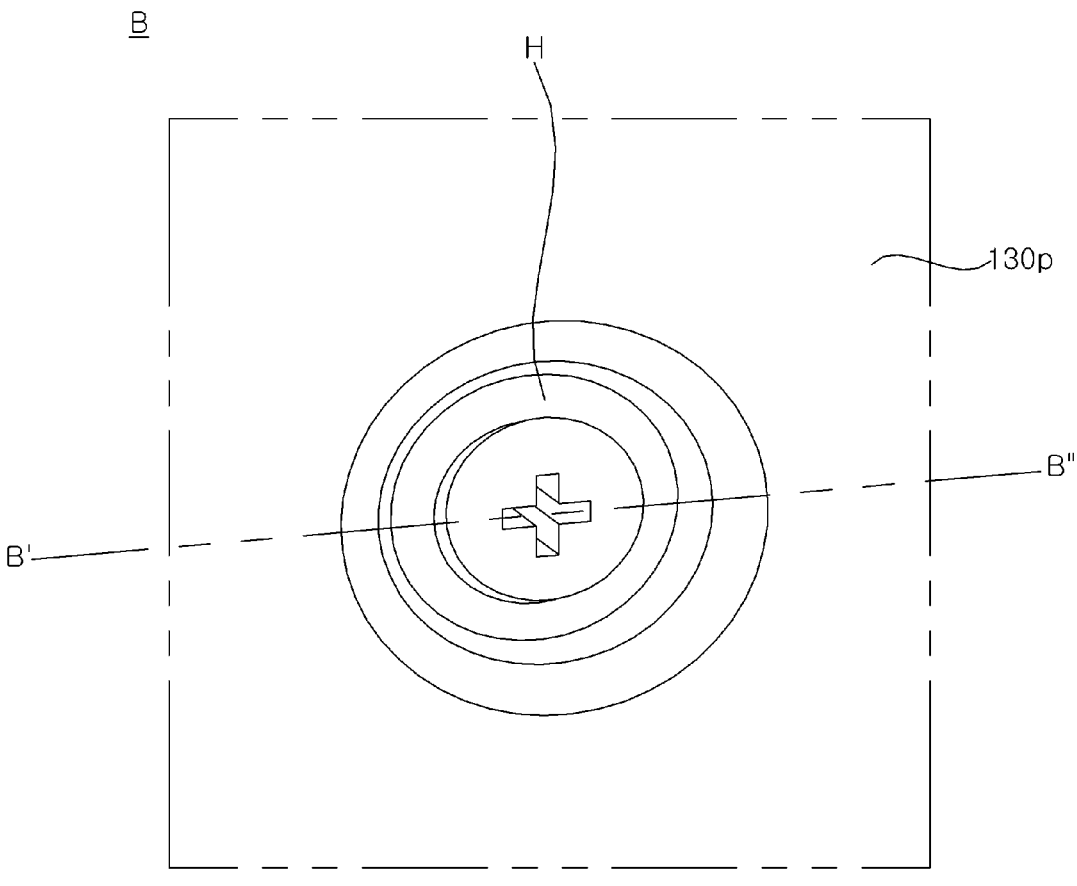
Figure 8:
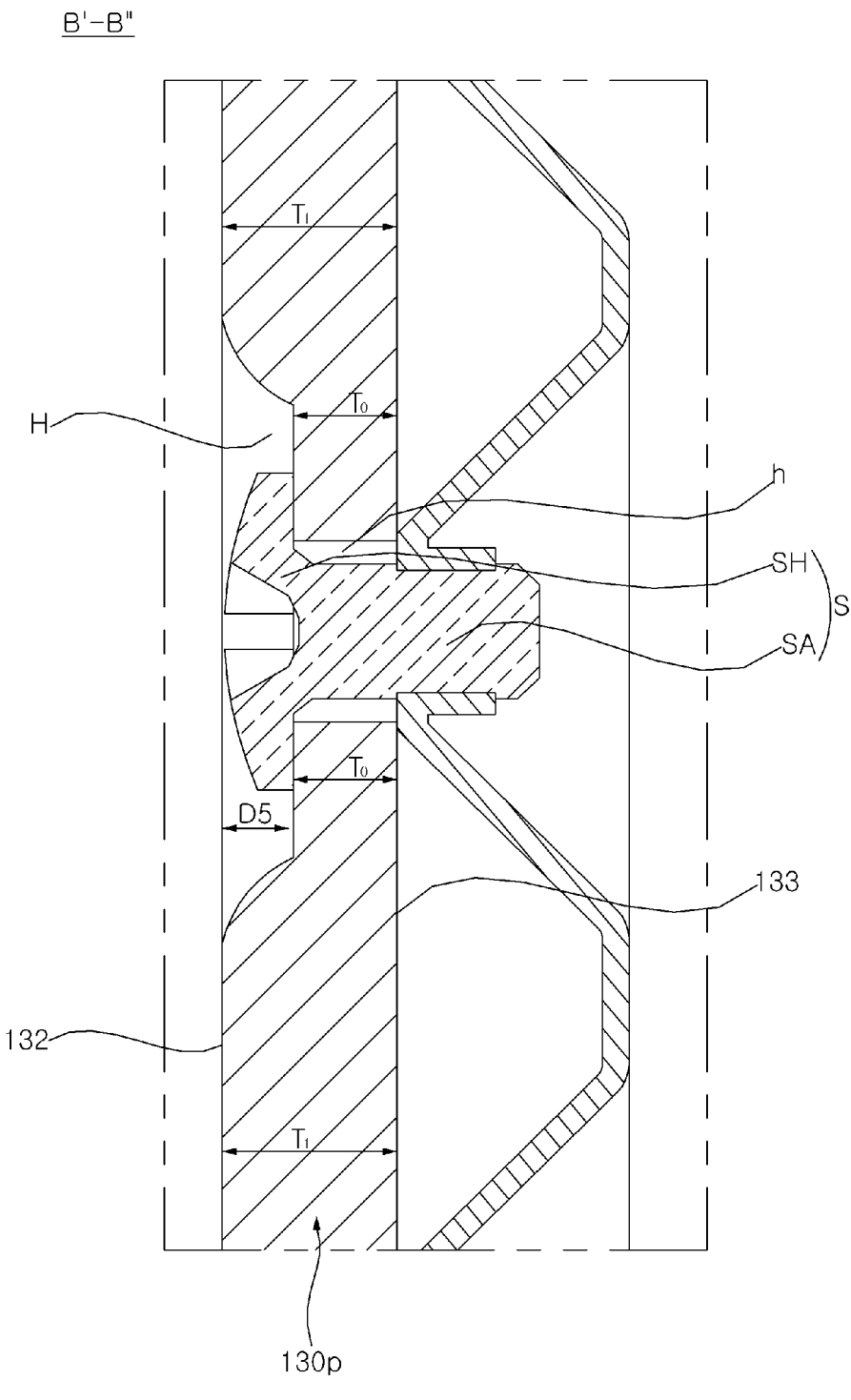

Referring to FIGS. 7 and 8, the fastening groove H may be formed in the flat part 130P. The fastening groove H may be formed by pressing the flat part 130P. The front skin 132 of the fastening groove H may be formed by being recessed from the front skin 132 of the flat part 130P. The rear skin 133 of the flat part 130P and the rear skin 133 of the fastening groove H may form the same plane. A thickness TO of the fastening groove H may be less than a thickness T1 of the flat part 130P.

The fastening groove H may be provided at its center with a fastening hole h. The fastening hole h may be formed by punching the fastening groove H. The fastening hole h may be formed through the front skin 132 and the rear skin 133 of the fastening groove H. The length of a shaft SA of a fastening member S may be greater than the thickness TO of the fastening groove H. The shaft SA of the fastening member S may be inserted into the fastening groove H and protrude out of the rear skin 132 of the fastening groove H through the fastening hole h. A depth D5 of the fastening groove H may be greater than the thickness of a head SH. The head SH of the fastening member S may be hidden in the fastening groove H.

Figure 9:
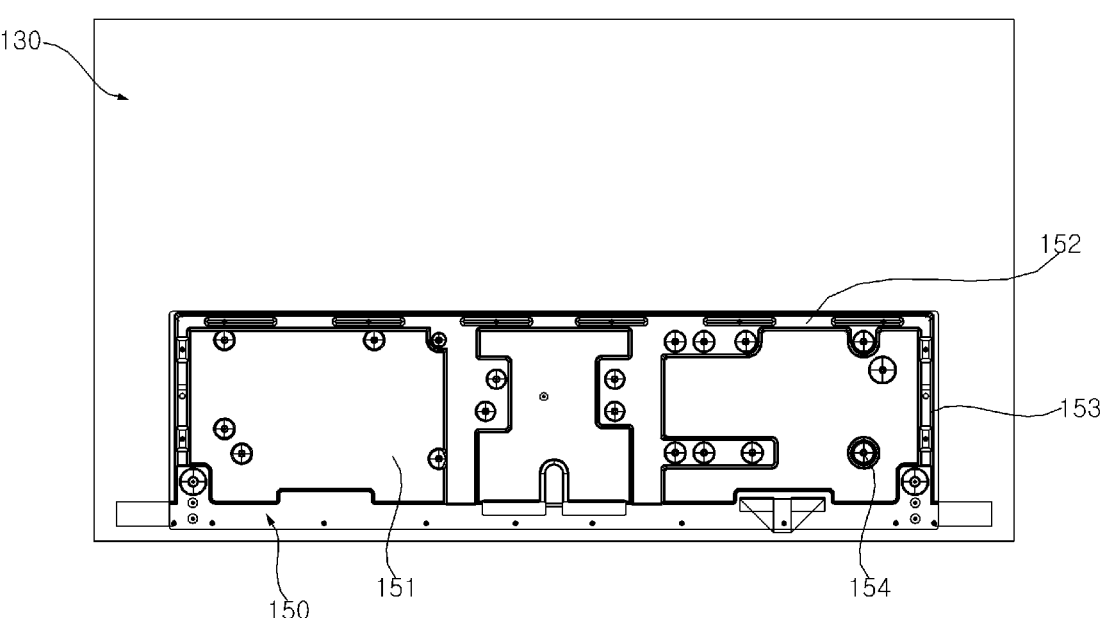
Figure 10:
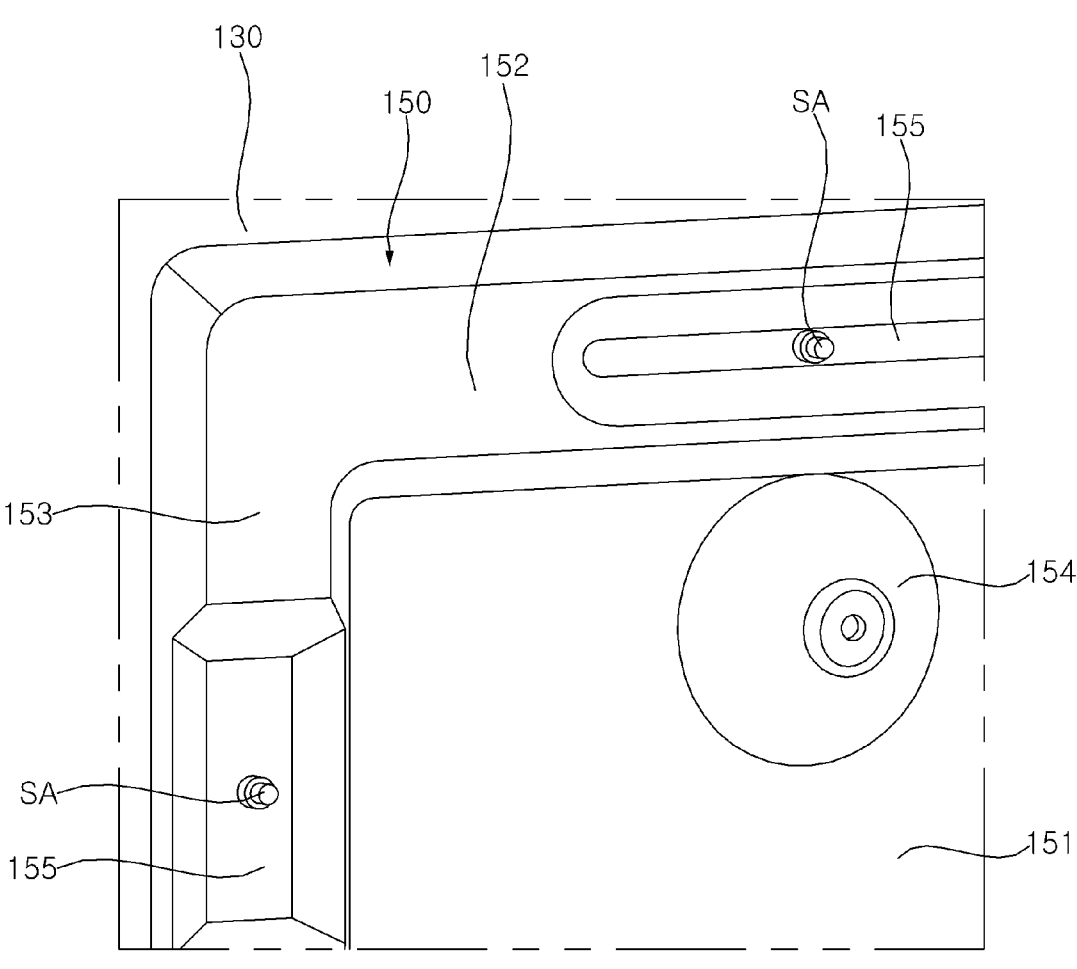

Referring to FIGS. 9 and 10 together with FIG. 8, a PCB plate 150 may be coupled to the rear of the material complexed panel 130. The PCB plate 150 may be fixed to the rear of the material complexed panel 130 by the fastening member S.

The PCB plate 150 may be formed by pressing a plate 151 including a metal. The PCB plate 150 may include a horizontal portion 152, a vertical portion 153, a dome portion 154, and a recessed portion 155. The horizontal portion 152 may protrude from the front to the rear of the PCB plate 151, and may be formed in a left-and-right direction of the PCB plate 151. The vertical portion 153 may protrude from the front to the rear of the PCB plate 151, and may be formed in an up-and-down direction of the PCB plate 150. The dome portion 154 may protrude from the front to the rear of the PCB plate 150. The recessed portion 155 may be recessed forward from the rear of the vertical portion 153 and/or the horizontal portion 152.

The shaft SA of the fastening member S may pass through the recessed portion 155 formed in the vertical portion 153 and/or the horizontal portion 152 so as to couple the material complexed panel 130 and the PCB plate 150 together. The recessed portion 155 may have a depth greater than a protruding length of the shaft SA of the fastening member S protruding rearward through the material complexed panel 130.

Figure 11:
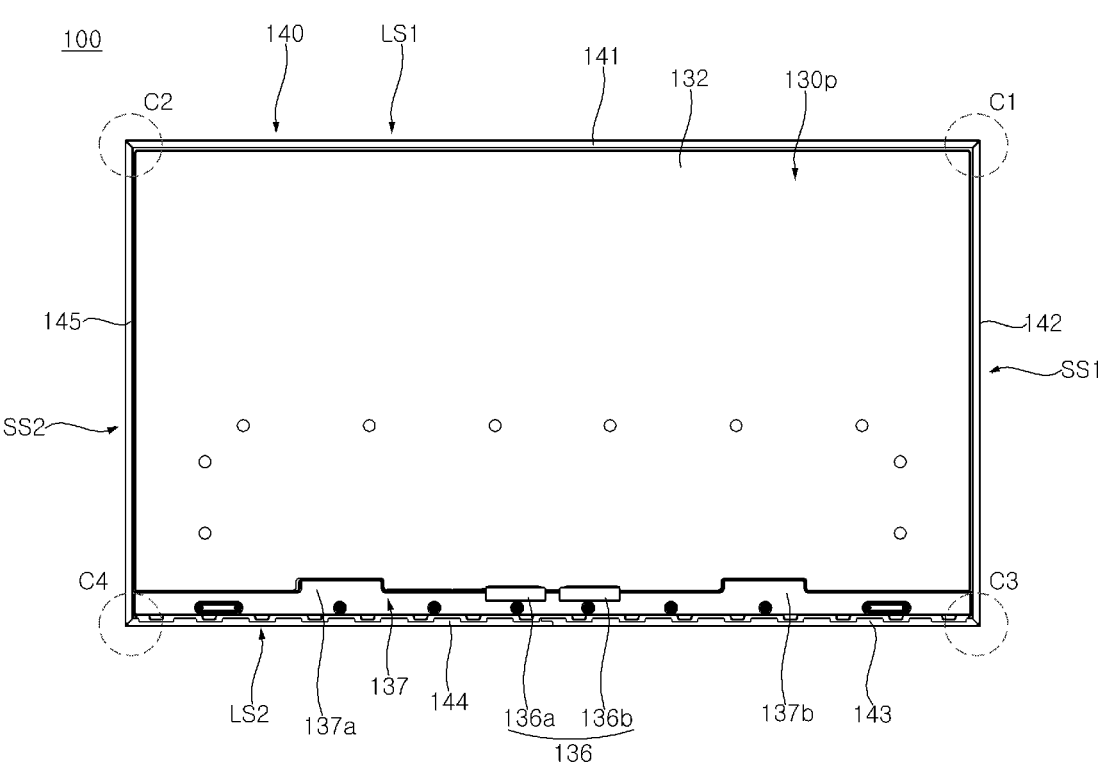
Figure 12:
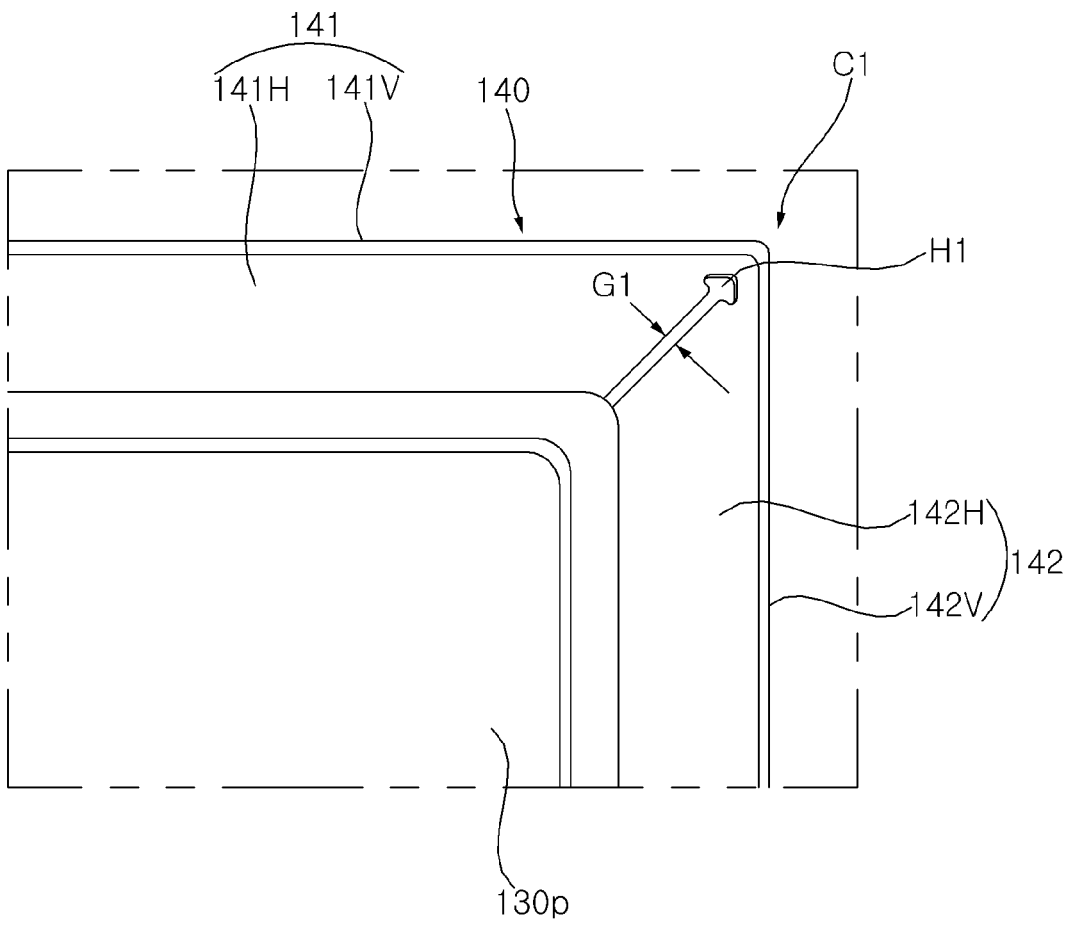

Referring to FIGS. 11 and 12, a side frame 140 may be coupled to the outer part 135 (see FIG. 5) adjacent to the flat part 130P. The side frame 140 may include a first part 141, a second part 142, a third part 143, a fourth part 144, and a fifth part 145. The second part 142 may be bent at a first corner C1 from the first part 141.

The first part 141 may include a horizontal portion 141H and a vertical portion 141V. The horizontal portion 141H of the first part 141 may be fixed on the first outer part 135a (see FIG. 5). The second part 142 may include a horizontal portion 142H and a vertical portion 142V. The horizontal portion 142H of the second part 142 may be fixed on the fourth outer part 135d (see FIG. 5).

A gap G1 may be formed between the horizontal portion 141H of the first part 141 and the horizontal portion 142H of the second part 142. The vertical portion 141V of the first part 141 and the vertical portion 142V of the second part 142 may be connected while being bent. A hole H1 connected to the gap G1 may be formed between the horizontal portions 141H and 142H while being adjacent to the vertical portions 141V and 142V. The size of the hole H1 or the diameter of the hole H1 may be greater than the width of the gap G1. The description of the first corner C1 of the side frame 140 may be equally applied to a second corner C2 of the side frame 140.

Figure 13:
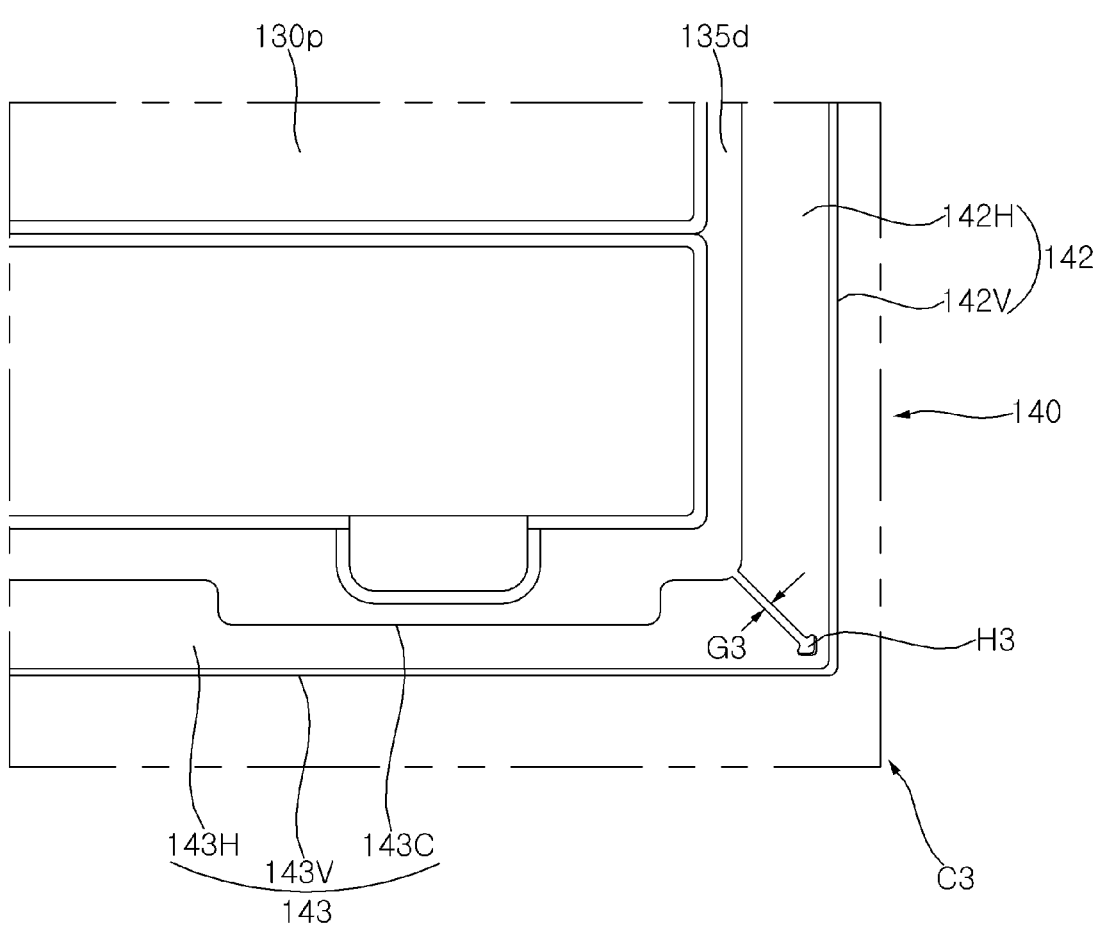

Referring to FIGS. 11 and 13, the side frame 140 may be coupled to the outer part 135 (see FIG. 5) adjacent to the flat part 130P. The side frame 140 may include a first part 141, a second part 142, a third part 143, a fourth part 144, and a fifth part 145. The second part 142 may be bent at a third corner C3 from the third part 143.

The third part 143 may include a horizontal portion 143H and a vertical portion 143V. The horizontal portion 143H of the third part 143 may be fixed on the third outer part 135c (see FIG. 5). The second part 142 may include a horizontal portion 142H and a vertical portion 142V. The horizontal portion 142H of the second part 142 may be fixed on the fourth outer part 135d (see FIG. 5).

A gap G3 may be formed between the horizontal portion 143H of the third part 143 and the horizontal portion 142H of the second part 142. The vertical portion 143V of the third part 143 and the vertical portion 142V of the second part 142 may be connected while being bent. A hole H3 connected to the gap G3 may be formed between the horizontal portions 143H and 142H while being adjacent to the vertical portions 143V and 142V. The size of the hole H3 or the diameter of the hole H3 may be greater than the width of the gap G3. The description of the third corner C3 of the side frame 140 may be equally applied to a fourth corner C4 of the side frame 140.

Figure 14:
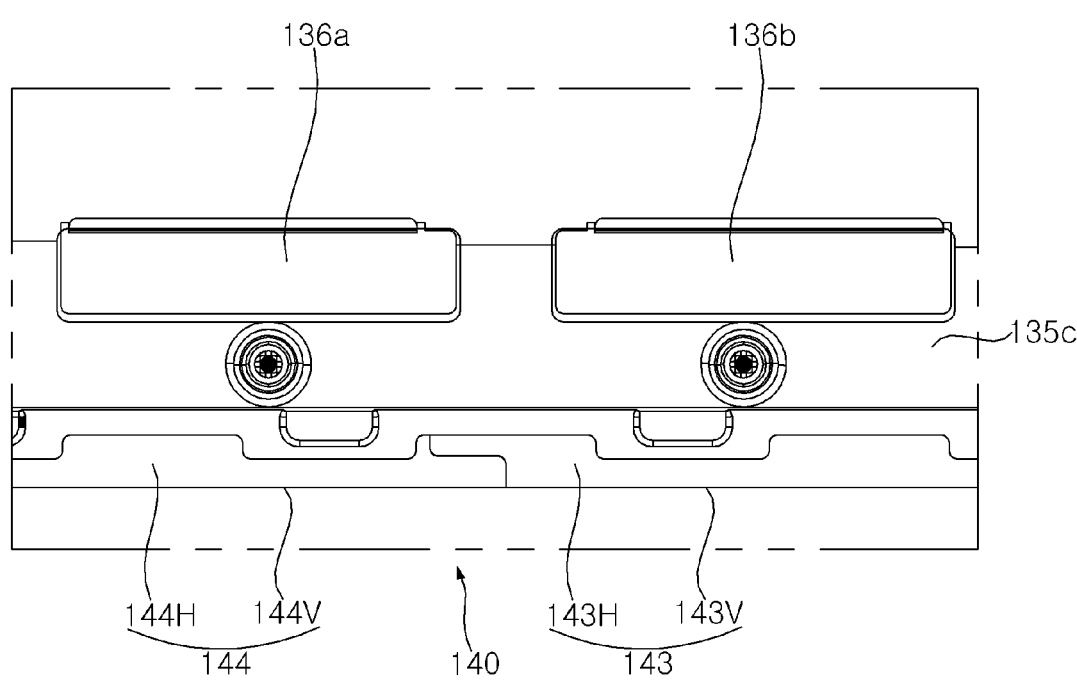

Referring to FIGS. 11 and 14, the third part 143 and the fourth part 144 of the side frame 140 may be positioned or fixed on the third outer part 135c. An end of the third part 143 of the side frame 140 may be coupled to an end of the fourth part 144 of the side frame 140.

A horizontal portion 144H of the fourth part 144 may be in contact with the horizontal portion 143H and the vertical portion 143V of the third part 143. A vertical portion 144V of the fourth part 144 may be in contact with the vertical portion 143V of the third part 143. The vertical portion 143V of the third part 143 may be in contact with the horizontal portion 144H and the vertical portion 144V of the fourth part 144. The end of the third part 143 may be fixed to the end of the fourth part 144. For example, the end of the third part 143 and the end of the fourth part 144 may be fixed by welding.

Figure 15:
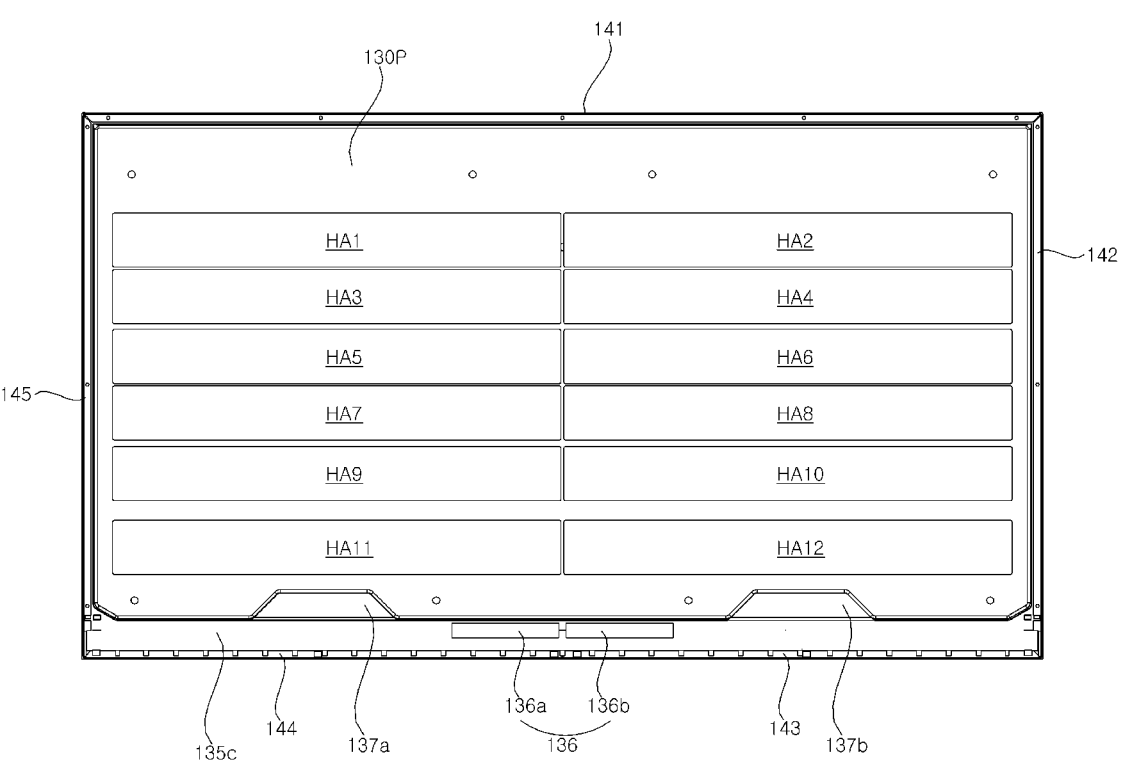

Referring to FIG. 15, a heat sink HA may be elongated and be fixed to the flat part 130P. The heat sink HA may be provided in plurality. For example, the heat sink HA may be a plate including aluminum. As another example, the heat sink HA may be a tape including aluminum. A plurality of heat sinks HA may be provided.

A first heat sink HA1 may be elongated in a left-and-right direction of the flat part 130P, and may be positioned adjacent to the first part 141 of the side frame 140. A second heat sink HA2 may be elongated in the left-and-right direction of the flat part 130P, and may be positioned adjacent to the first part 141 of the side frame 140 while adjoining the first heat sink HA1. The first heat sink HA1 and the second heat sink HA2 may be sequentially arranged along a longitudinal direction of the first part 141 of the side frame 140.

A third heat sink HA3 may be elongated in the left-and-right direction, and may be disposed adjacent to the first heat sink HA1 below the first heat sink HA1. A fourth heat sink HA4 may be elongated in the left-and-right direction, and may be disposed adjacent to the second heat sink HA2 below the second heat sink HA2.

A fifth heat sink HA5 may be elongated in the left-and-right direction, and may be disposed adjacent to the third heat sink HA3 below the third heat sink HA3. A sixth heat sink HA6 may be elongated in the left-and-right direction, and may be disposed adjacent to the fourth heat sink HA4 below the fourth heat sink HA4.

A seventh heat sink HA7 may be elongated in the left-and-right direction, and may be disposed adjacent to the fifth heat sink HA5 below the fifth heat sink HA5. An eighth heat sink HA8 may be elongated in the left-and-right direction, and may be disposed adjacent to the sixth heat sink HA6 below the sixth heat sink HA6.

A ninth heat sink HA9 may be elongated in the left-and-right direction, and may be disposed adjacent to the seventh heat sink HA7 below the seventh heat sink HA7. A tenth heat sink HA10 may be elongated in the left-and-right direction, and may be disposed adjacent to the eighth heat sink HA8 below the eighth heat sink HA8.

An eleventh heat sink HA11 may be elongated in the left-and-right direction, and may be disposed adjacent to the ninth heat sink HA9 below the ninth heat sink HA9. A twelfth heat sink HA12 may be elongated in the left-and-right direction, and may be disposed adjacent to the tenth heat sink HA10 below the tenth heat sink HA10.

Figure 16:
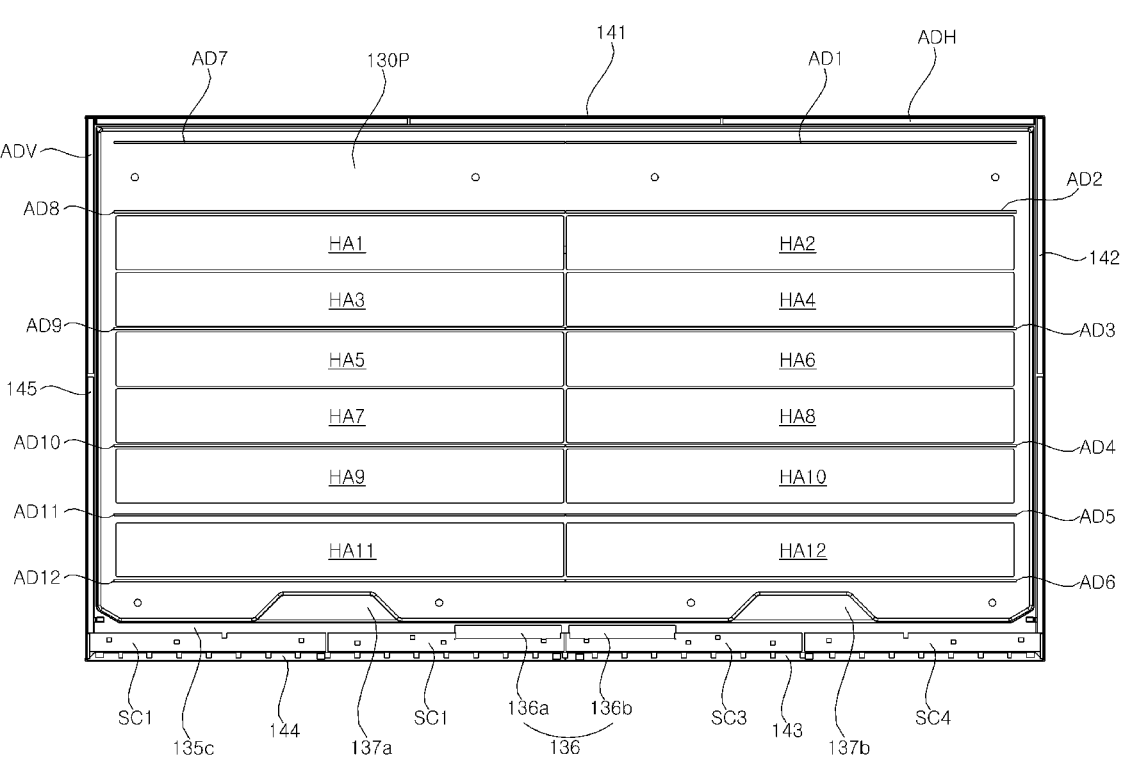

Referring to FIG. 16, a side adhesive member ADH, ADV may be fixed on the side frame 140. A plurality of side adhesive members ADH and ADV may be provided. Each of the plurality of side adhesive members ADH and ADV may be fixed to each of the first part 141, the second part 142, the third part 143, the fourth part 144, and the fifth part 145 of the side frame 140.

A panel adhesive member AD may be fixed on the flat part 130P. A plurality of panel adhesive members AD may be provided. A first panel adhesive member AD1 may be elongated in the left-and-right direction adjacent to the first part 141 of the side frame 140 so as to be fixed on the flat part 130P. A seventh panel adhesive member AD7 may be elongated in the left-and-right direction adjacent to the first part 141 of the side frame 140 so as to be fixed on the flat part 130P. The seventh panel adhesive member AD7 and the first panel adhesive member AD1 may be arranged in one line.

A second panel adhesive member AD2 may be elongated in the left-and-right direction adjacent to an upper side of the second heat sink HA2 so as to be fixed on the flat part 130P. A third panel adhesive member AD3 may be elongated in the left-and-right direction so as to be fixed on the flat part 130P between the fourth heat sink HA4 and the sixth heat sink HA6. A fourth panel adhesive member AD4 may be elongated in the left-and-right direction so as to be fixed on the flat part 130P between the eighth heat sink HA8 and the tenth heat sink HA10.

A fifth panel adhesive member AD5 may be elongated in the left-and-right direction so as to be fixed on the flat part 130P between the tenth heat sink HA10 and the twelfth heat sink HA12. A sixth panel adhesive member AD6 may be elongated in the left-and-right direction adjacent to a lower side of the twelfth heat sink HA12 so as to be fixed on the flat part 130P.

An eighth panel adhesive member AD8 may be elongated in the left-and-right direction adjacent to an upper side of the first heat sink HA1 so as to be fixed on the flat part 130P. A ninth panel adhesive member AD9 may be elongated in the left-and-right direction so as to be fixed on the flat part 130P between the third heat sink HA3 and the fifth heat sink HA5. A tenth panel adhesive member AD10 may be elongated in the left-and-right direction so as to be fixed on the flat part 130P between the seventh heat sink HA7 and the ninth heat sink HA9.

An eleventh panel adhesive member AD11 may be elongated in the left-and-right direction so as to be fixed on the flat part 130P between the ninth heat sink HA9 and the eleventh heat sink HA11. A twelfth panel adhesive member AD12 may be elongated in the left-and-right direction adjacent to a lower side of the eleventh heat sink HA11 so as to be fixed on the flat part 130P.

Figure 17:
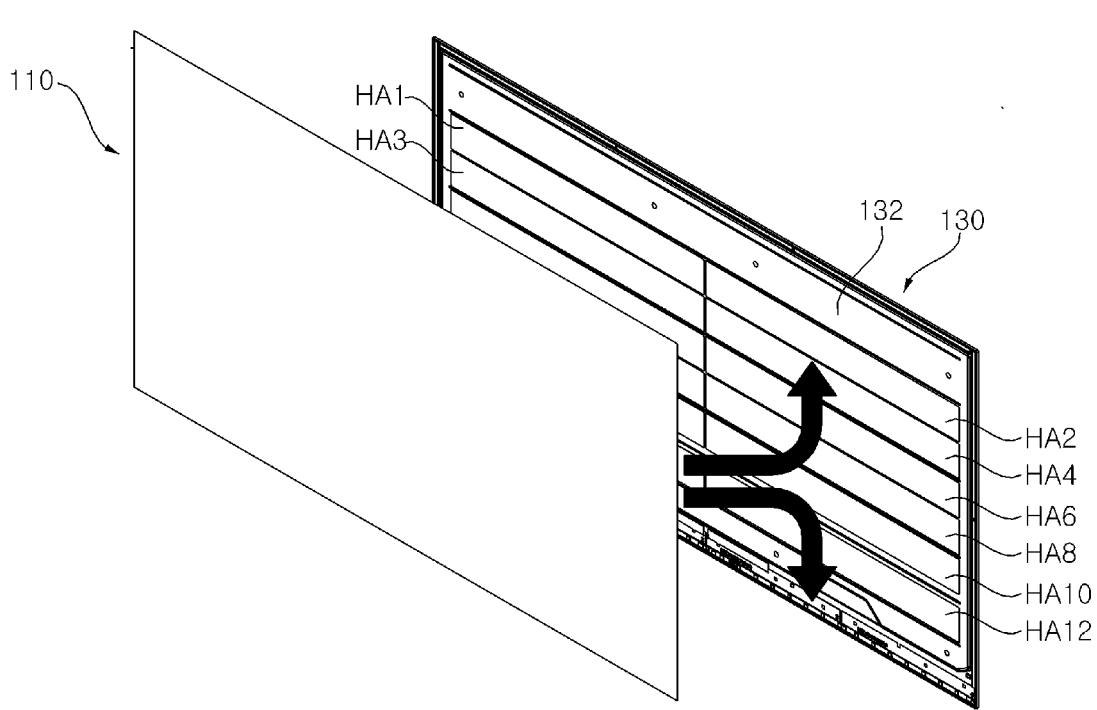
Figure 18:
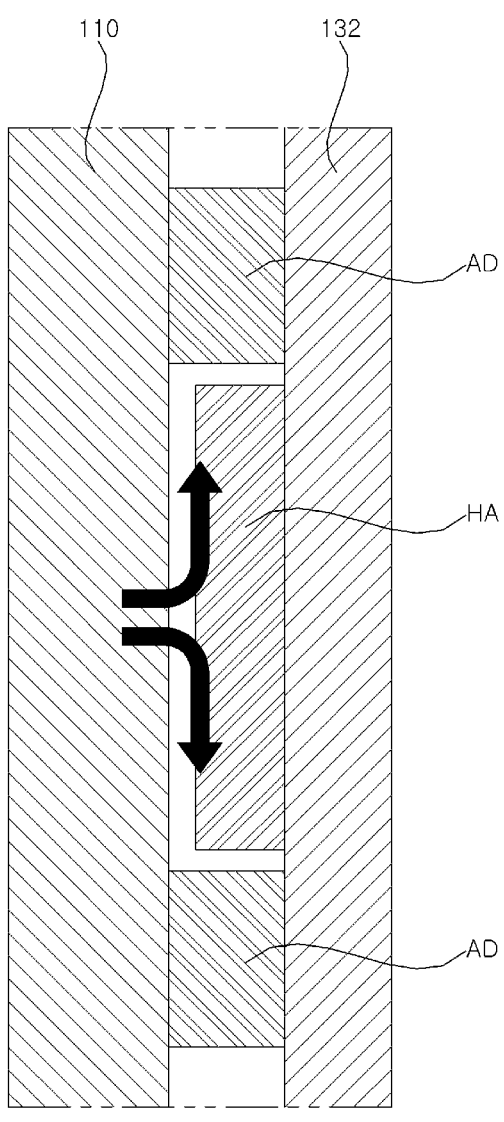

Referring to FIGS. 17 and 18, the display panel 110 may be coupled or fixed on the front skin 132 of the material complexed panel 130 by the adhesive member AD.

The heat sink HA may be disposed in an air-gap formed between the material complexed panel 130 and the display panel 110. A rear surface of the heat sink HA may be fixed to the front skin 132, and a front surface of the heat sink HA may be spaced apart from a rear surface of the display panel 110.

For example, the adhesive member AD may have a thickness of 0.2 to 0.4 mm. For example, the heat sink HA may have a thickness of 0.15 to 0.25 mm. For example, a gap formed between the display panel 110 and the heat sink HA may be 0.04 to 0.1 mm.

As a distance of the air-gap is reduced due to the heat sink HA, heat generated in the display panel 110 may be dissipated more effectively.

Figure 19:
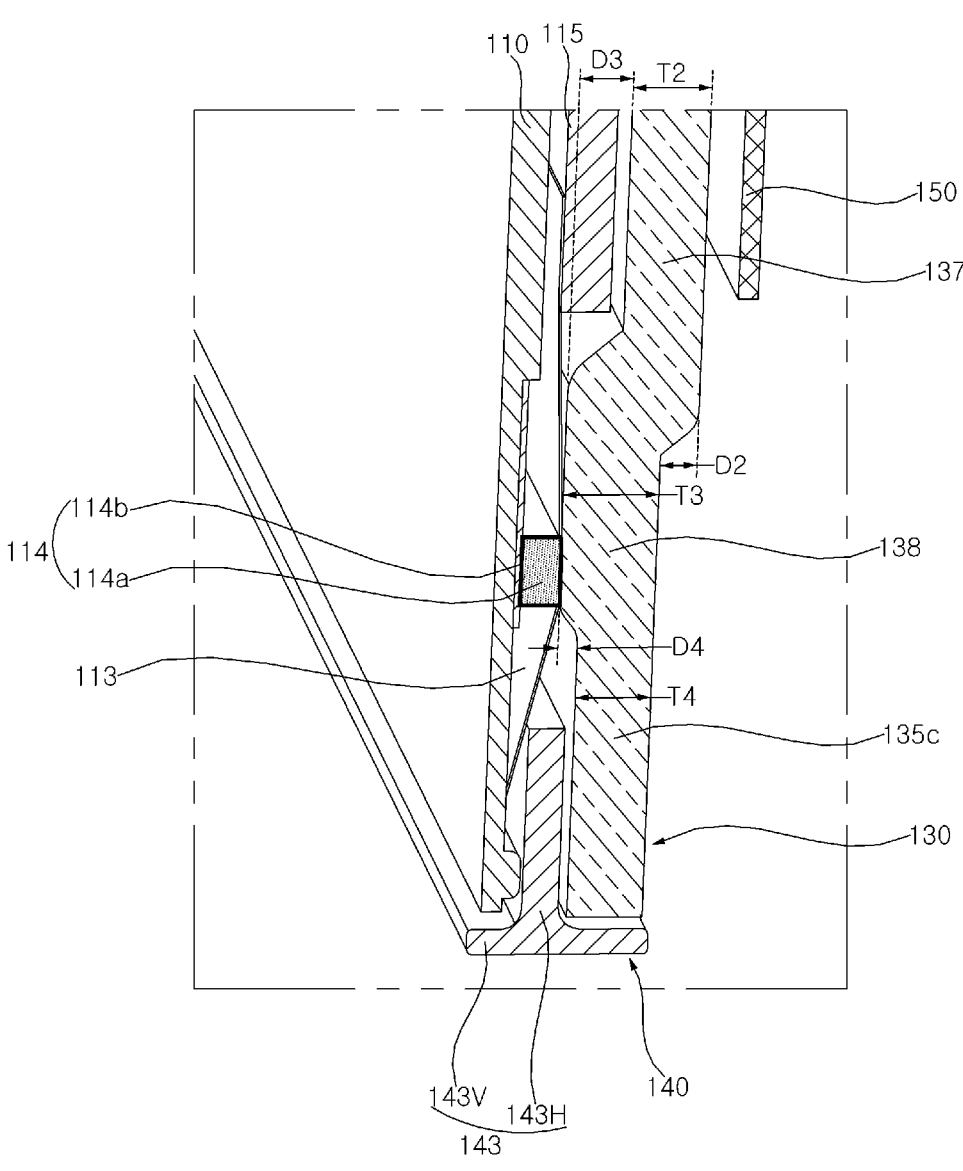

Referring to FIG. 19, the display panel 110 may be coupled or fixed on the side frame 140. The horizontal portion 143H of the side frame 140 may support the rear surface of the display panel 110, and the vertical portion 143V of the side frame 140 may cover a side surface of the display panel 110. For example, the vertical portion 143V of the third part 143 of the side frame 140 may cover a lower side surface of the display panel 110.

The vertical portion 143V may cover a side surface of the material complexed panel 130. For example, the vertical portion 143V of the third part 143 of the side frame 140 may cover a side surface of the third outer part 135c of the material complexed panel 130.

A flexible cable 113 may extend between the display panel 110 and the horizontal portion 143H of the side frame 140 from a lower side of the display panel 110. The flexible cable 113 may extend between the rear surface of the display panel 110 and the material complexed panel 130. For example, the flexible cable 113 may be a COF 113.

A source signal board 115 may be electrically connected to the flexible cable 113. The source signal board 115 may be fixed to one surface of the flexible cable 113. For example, the source signal board 115 may be an S-PCB 115. The source signal board 115 may be positioned in the accommodating part 137 of the material complexed panel 130.

The flexible cable 113 may be positioned between the protruding pad 138 of the material complexed panel 130 and the display panel 110. The flexible cable 113 may come into contact with the protruding pad 138. Heat generated in the source signal board 115 and/or the flexible cable 113 may be dissipated through the protruding pad 138.

A heat dissipation pad 114 may be disposed between the flexible cable 113 in contact with the protruding pad 138 and the rear surface of the display panel 110. The heat dissipation pad 114 may include an elastic material 114a and a conductive film 114b. The core 114a of the heat dissipation pad 114 may be formed of an elastic material, and the conductive film 114b may cover the core 114a of the heat dissipation pad 114. Accordingly, a state in which the flexible cable 113 is in contact with the protruding pad 138 may be maintained.

Figure 20:
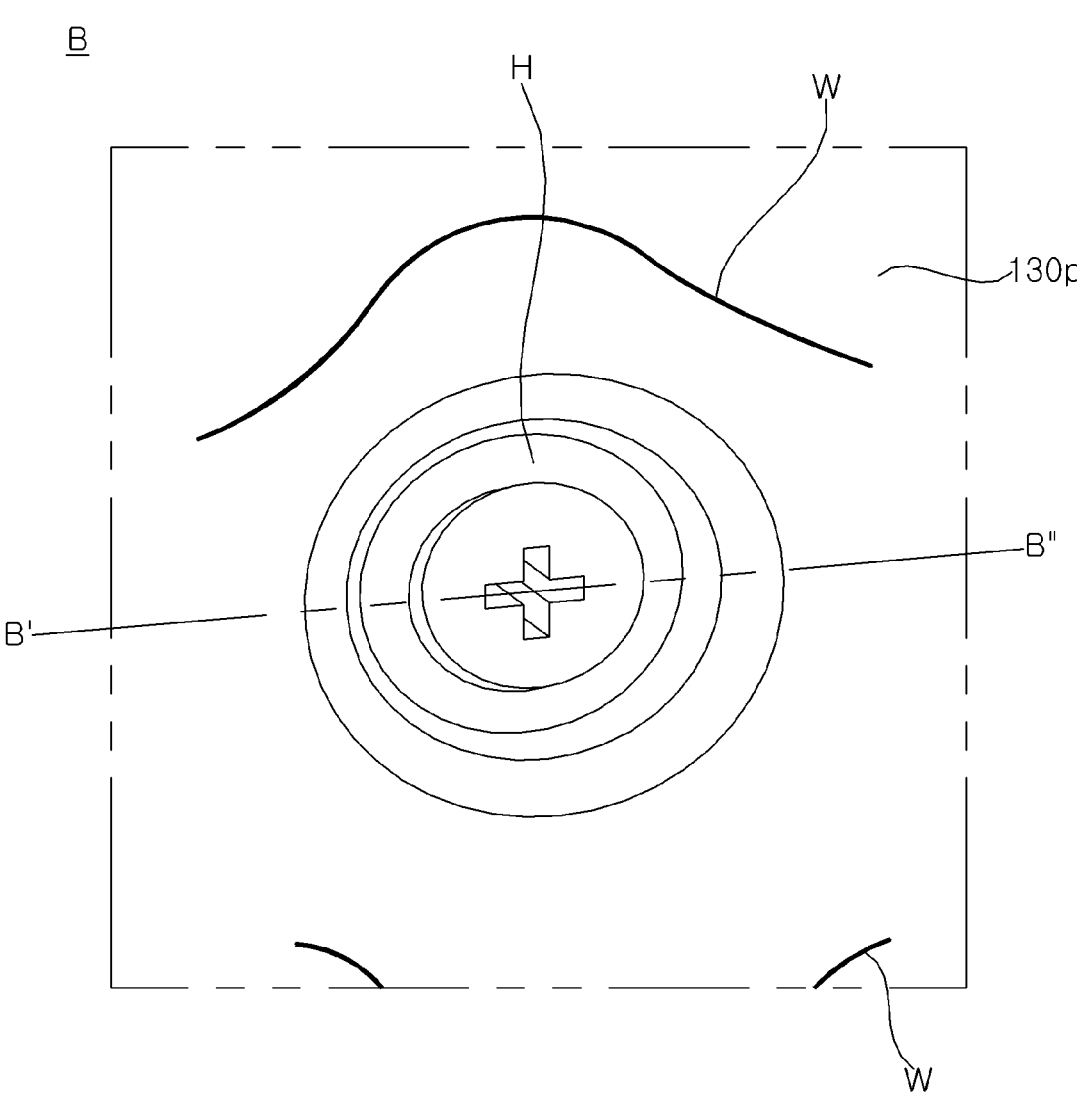
Figure 21:
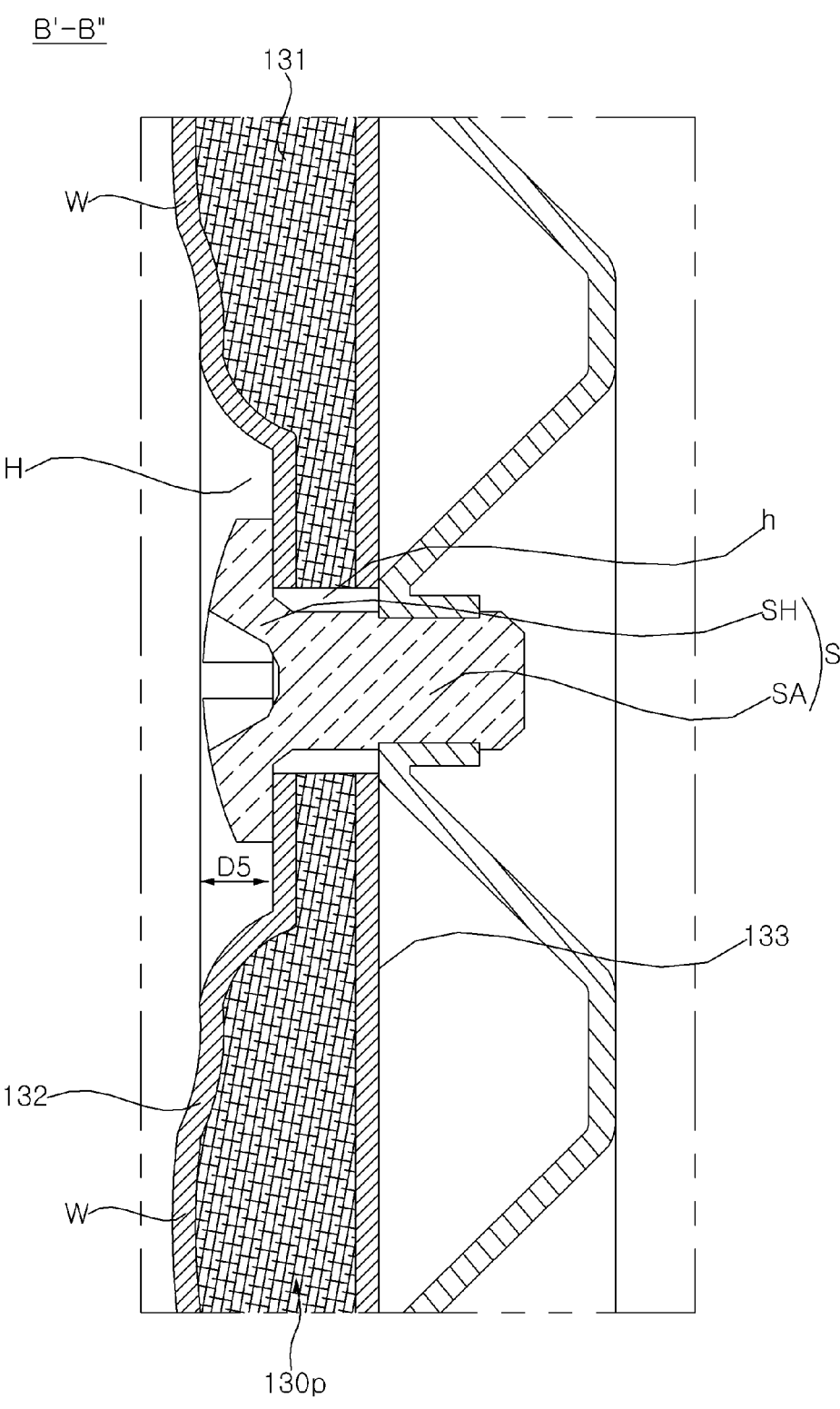

Referring to FIGS. 20 and 21, deformation in the front skin 132 and/or the rear skin 133 may occur during the formation of the fastening groove H in the flat part 130P, which means that a wall W or a barrier W may be formed around the fastening groove H. While forming the fastening groove H by pressing the flat part 130P, the core 131 at the fastening groove H may be compressed and the core 131 in the vicinity of the fastening groove H may be expanded. This may be due to the movement of the core 131 or a certain amount of the core 131 being pushed away. Deformation of the skin 132, 133 due to the compression and expansion of the core 131 may cause a defect in coupling of the display panel 110 and/or another structure to the material complexed panel 130, thereby leading to a reduction in structural reliability of the display device 100.

Figure 22:
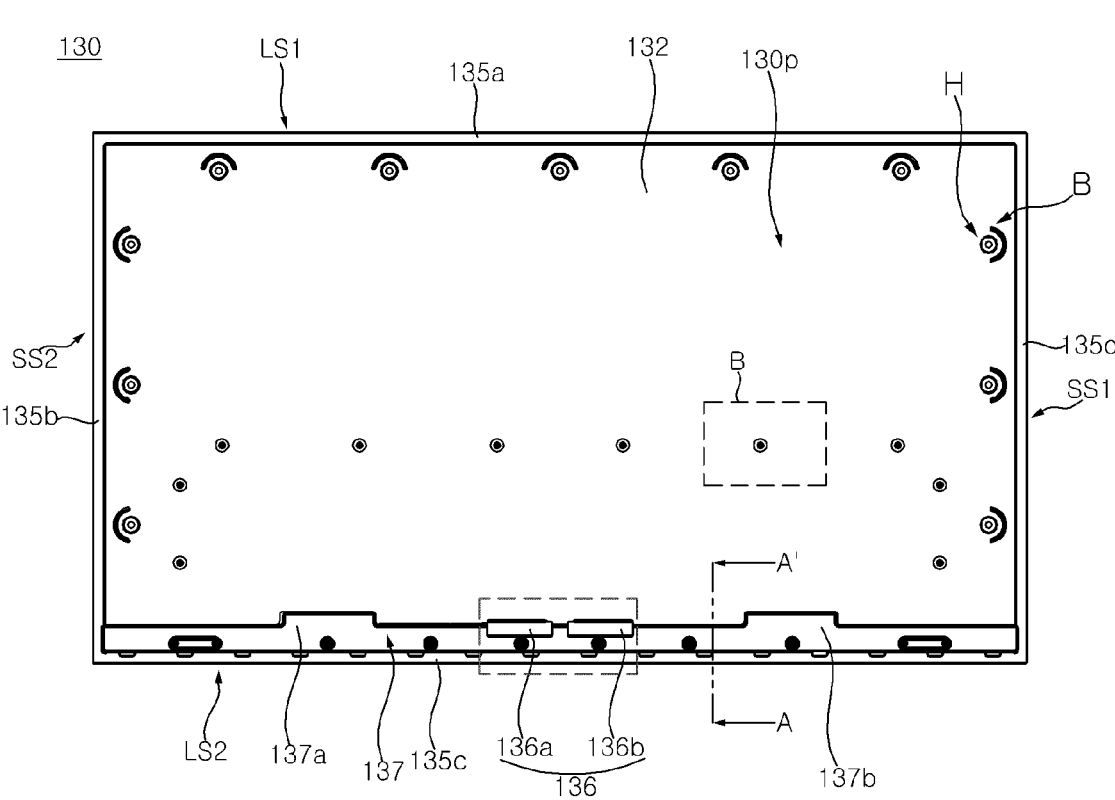
Figure 23:
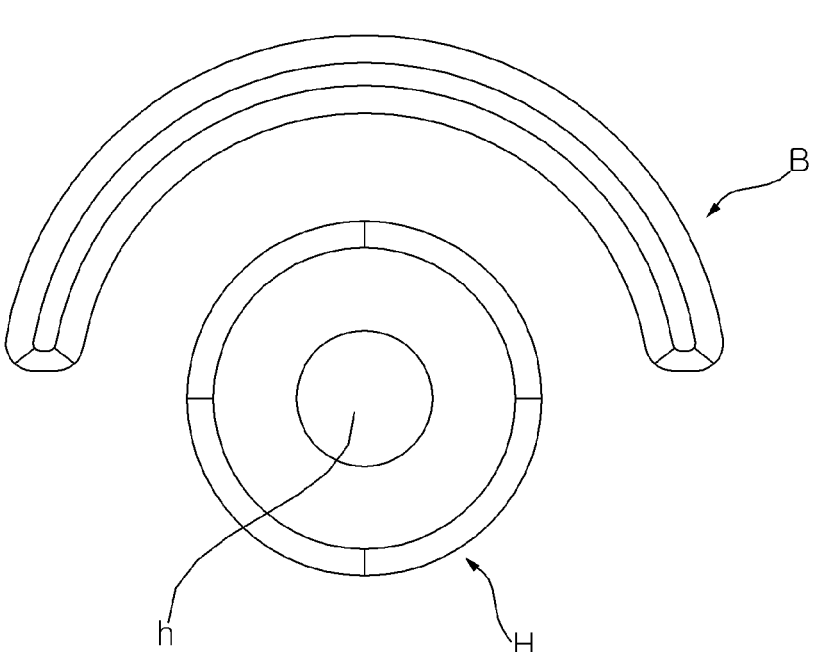

Referring to FIGS. 22 and 23, a barrier groove B may be formed around the fastening groove H. The barrier groove B may be referred to as a barrier B, a barrier recess B, or a trench B. The fastening groove H may have a circular shape, and may be provided at its center with a fastening hole h formed through the material complexed panel. For example, the fastening hole h may be formed through the front skin 132, the core 131, and the rear skin 133. The barrier groove B may be spaced apart from an outer circumference of the fastening groove H while surrounding the fastening groove H. For example, the barrier groove B may have a ring shape. As another example, the barrier groove B may have a semicircular ring shape. The barrier groove B may be formed by pressing the flat part 130P. The barrier groove B formed by pressing and depressing the flat part 130P may decrease in width from the flat part 130P toward a bottom of the barrier groove B.

The fastening grooves H and the barrier grooves B may be disposed along the first long side LS1, the first short side SS1, and/or the second short side SS2 of the material composite panel 130. When the fastening groove H and the barrier groove B are disposed along the first long side LS1, the barrier groove B may be positioned between the first long side LS1 and the fastening groove H. When the fastening groove H and the barrier groove B are disposed along the first short side SS1, the barrier groove B may be positioned between the first short side SS1 and the fastening groove H. When the fastening groove H and the barrier groove B are disposed along the second short side SS2, the barrier groove B may be positioned between the second short side SS2 and the fastening groove H. A plurality of fastening grooves H may be provided. A plurality of barrier grooves B may be provided. The number of barrier grooves B may correspond to the number of fastening grooves H. The plurality of barrier grooves B may be disposed to correspond to the plurality of fastening grooves H, respectively. Accordingly, it is possible to prevent the spread of deformation of the material complexed panel 130 that may occur during the formation of the groove H and the fastening hole h.

Thus, defective or poor coupling of the display panel 110 to the material complexed panel 130, which is due to a curve or bend in the skin 132, 133 generated during the formation of the fastening groove H, may be suppressed or reduced.

Figure 24:
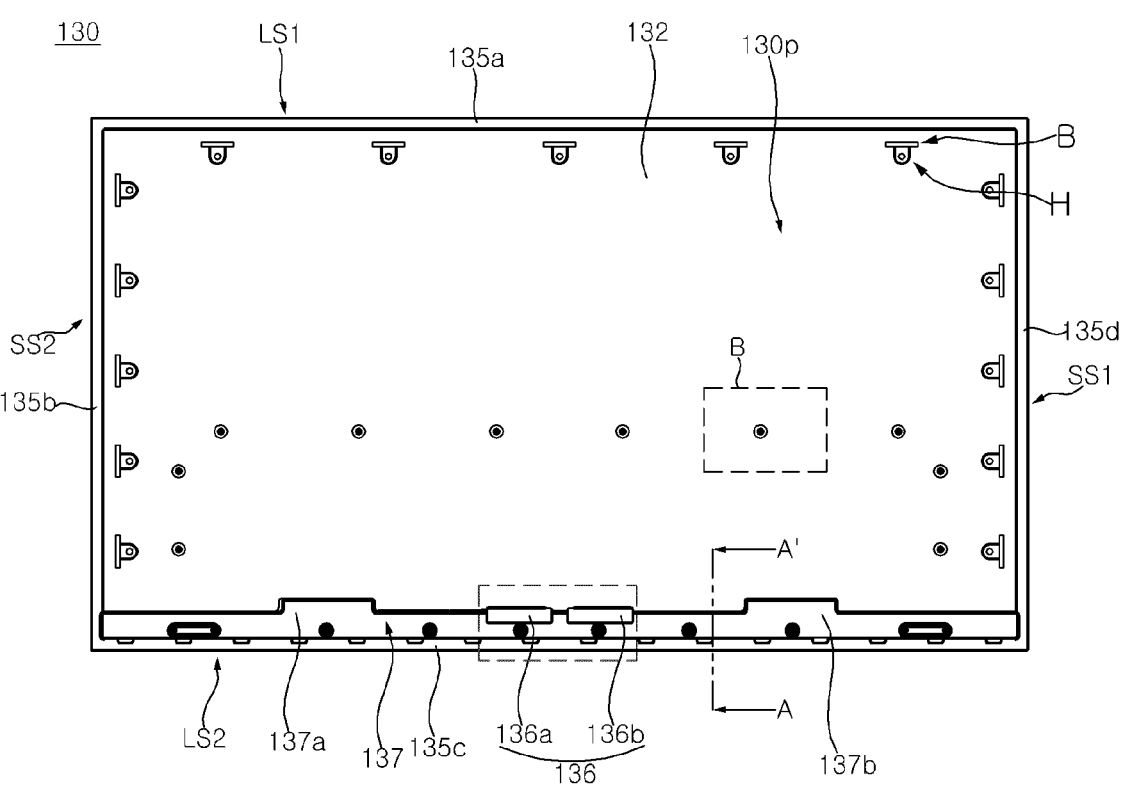
Figure 25:
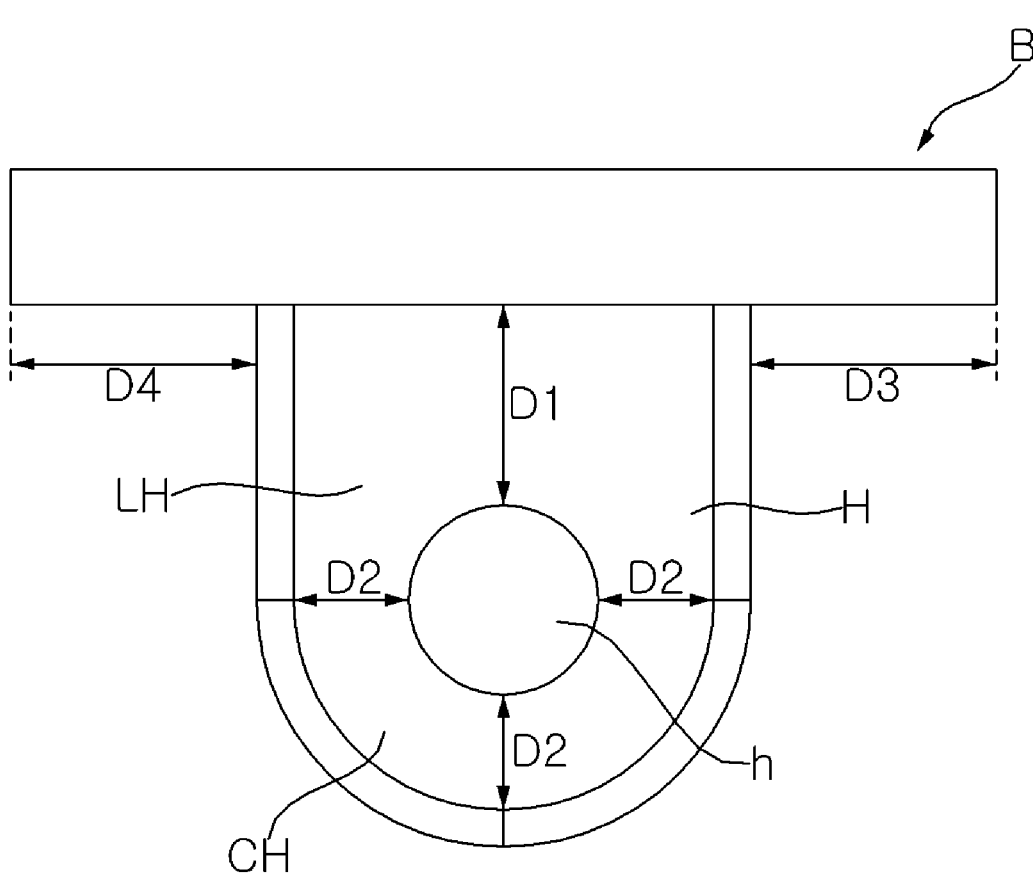

Referring to FIGS. 24 and 25, a barrier slit B may be formed adjacent to the fastening groove H. The barrier slit B may be referred to as a barrier B, a cut-out portion B, or a barrier cut B.

The fastening groove H may have the shape of the combination of a circle and a rectangle. A fastening hole h may be formed in the circle of the fastening groove H. A rectangular fastening groove LH may connect a circular fastening groove CH and the barrier slit B. The rectangular fastening groove LH may connect a semicircular fastening groove CH and the barrier slit B. In this case, the fastening hole h may be formed between the semicircular fastening groove CH and the rectangular fastening groove LH.

The barrier slit B may be formed by punching the flat part 130P. The barrier slit B may be formed by being penetrated by the front skin 132, the core 131, and the rear skin 133 of the flat part 130P.

A first distance D1 from the barrier slit B to an outer circumference of the fastening hole h may be greater than a second distance D2 from the outer circumference of the fastening hole h to a circumference of the circular fastening groove CH. A third distance D3 from a first end of the barrier slit B to an outer edge of the fastening groove H, LH may be different from a fourth distance D4 from a second end of the barrier slit B to the outer edge of the fastening groove H, LH. Accordingly, it is possible to prevent the spread of deformation of the material complexed panel 130 that may occur during the formation of the fastening groove H and the fastening hole h.

The fastening grooves H and the barrier slits B may be disposed along the first long side LS1, the first short side SS1, and/or the second short side SS2 of the material complexed panel 130. When the fastening groove H and the barrier slit B are disposed along the first long side LS1, the barrier slit B may be positioned between the first long side LS1 and the fastening groove H. In this case, the barrier slit B may be in contact with the fastening groove H. When the fastening groove H and the barrier slit B are disposed along the first short side SS1, the barrier slit B may be positioned between the first short side SS1 and the fastening groove H. In this case, the barrier slit B may be in contact with the fastening groove H. When the fastening groove H and the barrier slit B are disposed along the second short side SS2, the barrier slit B may be positioned between the second short side SS2 and the fastening groove H. In this case, the barrier slit B may be in contact with the fastening groove H.

Accordingly, poor coupling of the display panel 110 to the material complexed panel 130, which is due to a curve or bend in the skin 132, 133 generated during the formation of the fastening groove H, may be suppressed or reduced.

Figure 26:
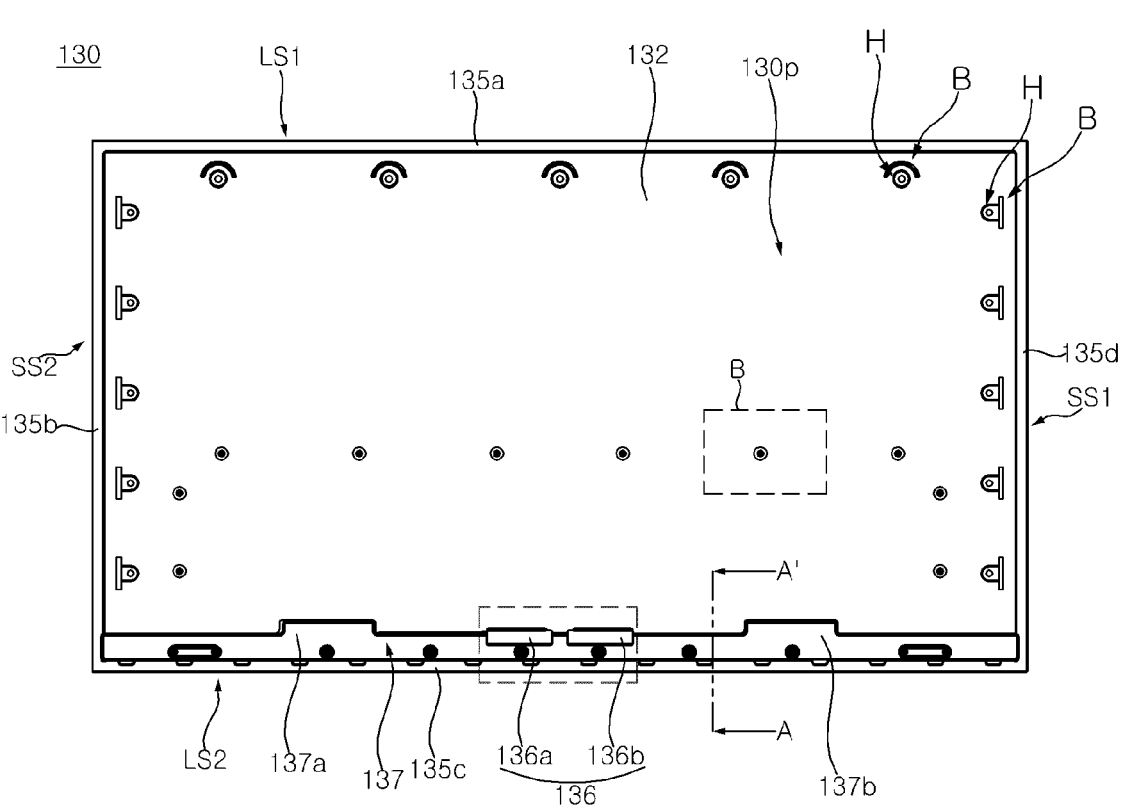

Referring to FIG. 26, barrier grooves B may be disposed along the first long side LS1. The barrier groove B may be positioned between the fastening groove H and the first long side LS1. Barrier slits B may be disposed along the first short side SS1. The barrier slit B may be positioned between the fastening groove H and the first short side SS1. Barrier slits B may be disposed along the second short side SS2. The barrier slit B may be positioned between the fastening groove H and the second short side SS2. Due to the combined arrangement of the barrier groove B and the barrier slit B, poor coupling of the display panel 110 to the material complexed panel 130 caused by a curve or bend in the material complexed panel 130 may be further suppressed or reduced.

Referring to FIGS. 1 to 26, according to an aspect of the present disclosure, a display device includes: a display panel 110; and a material complexed plate 130 disposed at a rear of the display panel 110. The material complexed plate 130 may include: a front skin 132 defining a front surface; a rear skin 133 defining a rear surface and facing the front skin 132; a core 131 disposed between the front skin 132 and the rear skin 133, and including fibers; a fastening groove H formed by pressing the front skin 132 and the core 131; and a barrier B disposed adjacent to the fastening groove H and formed by depressing or cutting the front skin 132.

The fastening groove H may be formed by pressing the core 131 and depressing the front skin 132 in a direction toward the rear skin 133.

The fastening groove H may be formed by depressing the front skin 132 into a circular shape, and may have, at a center thereof, a fastening hole h formed through the front skin 132, the core 131, and the rear skin 133. The barrier B may be formed by depressing the front skin 132 into a semicircular shape, and may be spaced apart from the fastening groove H.

The fastening groove H may be formed in a recessed manner, and may have a fastening hole h formed through the front skin 132, the core 131, and the rear skin 133. The barrier B may be in contact with the fastening groove H, and may be formed by cutting the front skin 132.

The barrier B may be elongated in a tangential direction of the fastening groove H, and may be formed by being penetrated by the front skin 132, the core 131, and the rear skin 133.

A first distance D1 from the barrier B to the fastening hole h may be greater than a second distance D2 from the fastening hole h to an inner wall of the fastening groove H.

A third distance D3 from a first end of the barrier B to the fastening groove H may be different from a fourth distance D4 from a second end of the barrier B to the fastening groove H.

The display panel 110 and the material complexed plate 130 may include: a flat part 130P having a shape corresponding to the display panel 110; and an outer part 135 defining a perimeter of the flat part 130P. The fastening groove H may be formed in the flat part 130P, and the barrier B may be formed between the outer part 135 and the fastening groove H.

There may further be provided a side frame 140 disposed between the display panel 110 and the material complexed plate 130, fixed to the material complexed plate 130, and to which the display panel 110 is coupled. The outer part 135 may be formed as a front surface of the front skin 132 is depressed by pressing the core 131. The side frame 140 may include: a horizontal portion disposed on the outer part 135 between the display panel 110 and the front skin 132; and a vertical portion extending while intersecting the horizontal portion, and covering a side surface of the display panel 110 or a side surface of the material complexed plate 130.

The side frame 140 may include: a first part 141 elongated along an upper side of the material complexed plate 130; a second part 142 bent from the first part 141 and elongated along a right side of the material complexed plate 130; a third part 143 bent from the second part 142 and elongated along a lower side of the material complexed plate 130; a fourth part 145 bent from the first part 141 and elongated along a left side of the material complexed plate 130; and a fifth part 144 bent from the fourth part 145 and elongated along the lower side of the material complexed plate 130. An end of the third part 143 may be coupled to an end of the fifth part 144.

There may further be provided a fastening member S passing through the fastening hole h. The fastening member S may include: a shaft SA disposed in the fastening hole h; and a head SH connected to the shaft SA and disposed at a front skin 132 of the fastening groove H. A thickness of the head SH may be less than a depth of the fastening groove H.

There may further be provided a PCB plate 150 disposed opposite the display panel 110 with respect to the material complexed plate 130 and coupled to a rear of the material complexed plate 130. The PCB plate 150 may be fixed to the material complexed plate 130 by the fastening member S.

Certain embodiments or other embodiments of the disclosure described above are not mutually exclusive or distinct from each other. Any or all elements of the embodiments of the disclosure described above may be combined or combined with each other in configuration or function.

For example, a configuration "A" described in one embodiment of the disclosure and the drawings, and a configuration "B" described in another embodiment of the disclosure and the drawings may be combined with each other. Namely, although the combination between the configurations is not directly described, the combination is possible except in the case where it is described that the combination is impossible.

The above detailed description is to be construed in all aspects as illustrative and not restrictive. The scope of the disclosure should be determined by reasonable interpretation of the appended claims and all changes coming within the equivalency range of the disclosure are intended to be embraced in the scope of the disclosure.

The invention claimed is:

1. A display device comprising:
a display panel; and
a material complexed plate at a rear of the display panel, wherein the material complexed plate comprises:
a front skin forming a front surface;
a rear skin forming a rear surface and facing the front skin;
a core disposed between the front skin and the rear skin, and comprising fibers;
a fastening groove formed by pressing the front skin and the core; and
a barrier disposed adjacent to the fastening groove and formed by depressing or cutting the front skin,
wherein the fastening groove is formed by pressing the core and depressing the front skin in a direction toward the rear skin,
wherein the fastening groove is formed by depressing the front skin into a circular shape, and includes a fastening hole formed through the front skin, the core, and the rear skin at a center of the circular shape, and
wherein the barrier is formed by depressing the front skin into a semicircular shape, and is spaced apart from the fastening groove.

2. A display device comprising:
a display panel; and
a material complexed plate at a rear of the display panel, wherein the material complexed plate comprises:
a front skin forming a front surface;
a rear skin forming a rear surface and facing the front skin;
a core disposed between the front skin and the rear skin, and comprising fibers;

a fastening groove formed by pressing the front skin and the core; and
a barrier disposed adjacent to the fastening groove and formed by depressing or cutting the front skin,
wherein the fastening groove is formed by pressing the core and depressing the front skin in a direction toward the rear skin,
wherein the fastening groove is depressed and comprises a fastening hole penetrating through the front skin, the core, and the rear skin, and
wherein the barrier is in contact with the fastening groove, and is formed by cutting the front skin.

3. The display device of claim 2, wherein the barrier is elongated in a tangential direction of the fastening groove, and is formed by being penetrated by the front skin, the core, and the rear skin.

4. The display device of claim 3, wherein a first distance from the barrier to the fastening hole is greater than a second distance from the fastening hole to an inner wall of the fastening groove.

5. The display device of claim 4, wherein a third distance from a first end of the barrier to the fastening groove in a lengthwise direction of the barrier is different from a fourth distance from a second end of the barrier to the fastening groove in the lengthwise direction of the barrier.

6. The display device of claim 2, further comprising a fastening member passing through the fastening hole,
wherein the fastening member comprises:
a shaft disposed in the fastening hole; and
a head connected to the shaft and disposed on a front skin of the fastening groove, and
wherein a thickness of the head is less than a depth of the fastening groove.

7. The display device of claim 6, further comprising a PCB plate disposed opposite the display panel with respect to the material complexed plate, and coupled to a rear of the material complexed plate,
wherein the PCB plate is fixed to the material complexed plate by the fastening member.

8. A display device comprising:
a display panel; and
a material complexed plate at a rear of the display panel, wherein the material complexed plate comprises:
a front skin forming a front surface;
a rear skin forming a rear surface and facing the front skin;
a core disposed between the front skin and the rear skin, and comprising fibers;
a fastening groove formed by pressing the front skin and the core; and
a barrier disposed adjacent to the fastening groove and formed by depressing or cutting the front skin,
wherein the material complexed plate comprises:
a flat part having a shape corresponding to the display panel; and
an outer part forming a perimeter of the flat part,
wherein the fastening groove is formed in the flat part, and
wherein the barrier is formed between the outer part and the fastening groove.

9. The display device of claim 8, further comprising a side frame disposed between the display panel and the material complexed plate, fixed to the material complexed plate, and to which the display panel is coupled,
wherein the outer part is formed as a front surface of the front skin is depressed by pressing the core, and
wherein the side frame comprises:

a horizontal portion disposed on the outer part between the display panel and the front skin; and a vertical portion extending in an intersecting direction of the horizontal portion, and covering a side surface of the display panel or a side surface of the material complexed plate.

10. The display device of claim 9, wherein the side frame comprises:

a first part elongated along an upper side of the material complexed plate;

a second part bent from the first part and elongated along a right side of the material complexed plate;

a third part bent from the second part and elongated along a lower side of the material complexed plate;

a fourth part bent from the first part and elongated along a left side of the material complexed plate; and a fifth part bent from the fourth part and elongated along the lower side of the material complexed plate, and wherein an end of the third part is coupled to an end of the fifth part.

\* \* \* \* \*